United States Patent
Smith

(10) Patent No.: US 9,429,638 B2
(45) Date of Patent: Aug. 30, 2016

(54) METHOD OF REPLACING AN EXISTING CONTACT OF A WAFER PROBING ASSEMBLY

(71) Applicant: CASCADE MICROTECH, INC., Beaverton, OR (US)

(72) Inventor: Kenneth R. Smith, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 546 days.

(21) Appl. No.: 13/854,725

(22) Filed: Apr. 1, 2013

(65) Prior Publication Data

US 2013/0220513 A1 Aug. 29, 2013

Related U.S. Application Data

(63) Continuation of application No. 12/592,186, filed on Nov. 20, 2009, now Pat. No. 8,410,806.

(60) Provisional application No. 61/199,910, filed on Nov. 21, 2008.

(51) Int. Cl.
| | |
|---|---|
| *H01R 43/20* | (2006.01) |
| *G01R 35/00* | (2006.01) |
| *G01R 1/067* | (2006.01) |
| *B32B 38/10* | (2006.01) |
| *G01R 1/073* | (2006.01) |

(52) U.S. Cl.
CPC ............... *G01R 35/00* (2013.01); *B32B 38/10* (2013.01); *G01R 1/06711* (2013.01); *G01R 1/06772* (2013.01); *G01R 1/0735* (2013.01); *Y10T 29/49126* (2015.01)

(58) Field of Classification Search
CPC  G01R 3/00; G01R 1/06711; G01R 1/06744; G01R 1/067; G01R 31/2851; Y10T 29/49147; Y10T 29/49117; Y10T 29/49126; Y10S 428/929
USPC .......... 29/876, 402.01, 402.08, 402.11, 874, 29/877; 156/64, 98; 324/750.24, 754.07, 324/755.01, 755.09, 755.11
See application file for complete search history.

(56) References Cited

U.S. PATENT DOCUMENTS

| | | | |
|---|---|---|---|
| 1,337,866 | A | 4/1920 | Whitaker |
| 2,142,625 | A | 1/1939 | Zoethout |
| 2,376,101 | A | 5/1945 | Tyzzer |
| 2,389,668 | A | 11/1945 | Johnson |

(Continued)

FOREIGN PATENT DOCUMENTS

| | | |
|---|---|---|
| DE | 4012839 | 10/1990 |
| DE | 4223658 | 1/1993 |

(Continued)

OTHER PUBLICATIONS

English-language abstract of Chinese Patent No. CN 1083975, Mar. 16, 1994.

(Continued)

*Primary Examiner* — Thiem Phan
(74) *Attorney, Agent, or Firm* — Dascenzo Intellectual Property Law, P.C.

(57) ABSTRACT

The contacts of a probing apparatus are elastically supported on a replaceable coupon and electrically interconnected with conductors on a membrane or a space transformer.

12 Claims, 11 Drawing Sheets

(56) References Cited

U.S. PATENT DOCUMENTS

| | | |
|---|---|---|
| 3,176,091 A | 3/1965 | Hanson et al. |
| 3,193,712 A | 7/1965 | Harris |
| 3,230,299 A | 1/1966 | Radziejowski |
| 3,401,126 A | 9/1968 | Miller et al. |
| 3,429,040 A | 2/1969 | Miller |
| 3,441,315 A | 4/1969 | Paes et al. |
| 3,442,831 A | 5/1969 | Dickstein et al. |
| 3,445,770 A | 5/1969 | Harmon |
| 3,484,679 A | 12/1969 | Hodgson et al. |
| 3,541,222 A | 11/1970 | Parks et al. |
| 3,595,228 A | 7/1971 | Simon et al. |
| 3,596,228 A | 7/1971 | Reed, Jr. et al. |
| 3,609,539 A | 9/1971 | Gunthert |
| 3,634,807 A | 1/1972 | Grobe et al. |
| 3,654,585 A | 4/1972 | Wickersham |
| 3,680,037 A | 7/1972 | Nellis et al. |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,806,801 A | 4/1974 | Bove |
| 3,829,076 A | 8/1974 | Sofy |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,008,900 A | 2/1977 | Khoshaba |
| 4,027,935 A | 6/1977 | Byrnes et al. |
| 4,038,599 A | 7/1977 | Bove et al. |
| 4,038,894 A | 8/1977 | Knibbe et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,135,131 A | 1/1979 | Larsen et al. |
| 4,184,729 A | 1/1980 | Parks et al. |
| 4,275,446 A | 6/1981 | Blaess |
| 4,277,741 A | 7/1981 | Faxvog et al. |
| 4,284,033 A | 8/1981 | del Rio |
| 4,284,682 A | 8/1981 | Frosch et al. |
| 4,287,473 A | 9/1981 | Sawyer |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,357,575 A | 11/1982 | Uren et al. |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,552,033 A | 11/1985 | Marzhauser |
| 4,567,321 A | 1/1986 | Harayama |
| 4,568,890 A | 2/1986 | Bates |
| 4,581,679 A | 4/1986 | Smolley |
| 4,588,950 A | 5/1986 | Henley |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,663,840 A | 5/1987 | Ubbens et al. |
| 4,673,839 A | 6/1987 | Veenendaal |
| 4,684,883 A | 8/1987 | Ackerman et al. |
| 4,691,163 A | 9/1987 | Blass et al. |
| 4,697,143 A | 9/1987 | Lockwood et al. |
| 4,705,447 A | 11/1987 | Smith |
| 4,707,657 A | 11/1987 | Bøegh-Petersen |
| 4,711,563 A | 12/1987 | Lass |
| 4,713,347 A | 12/1987 | Mitchell et al. |
| 4,719,417 A | 1/1988 | Evans |
| 4,725,793 A | 2/1988 | Igarashi |
| 4,727,391 A | 2/1988 | Tajima et al. |
| 4,727,637 A | 3/1988 | Buckwitz et al. |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,766,384 A | 8/1988 | Kleinberg et al. |
| 4,772,846 A | 9/1988 | Reeds |
| 4,780,670 A | 10/1988 | Cherry |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,812,754 A | 3/1989 | Tracy et al. |
| 4,827,211 A | 5/1989 | Strid et al. |
| 4,831,494 A | 5/1989 | Arnold et al. |
| 4,835,495 A | 5/1989 | Simonutti |
| 4,837,507 A | 6/1989 | Hechtman |
| 4,839,587 A | 6/1989 | Flatley et al. |
| 4,849,689 A | 7/1989 | Gleason et al. |
| 4,853,624 A | 8/1989 | Rabjohn |
| 4,853,627 A | 8/1989 | Gleason et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,891,584 A | 1/1990 | Kamieniecki et al. |
| 4,893,914 A | 1/1990 | Hancock et al. |
| 4,894,612 A | 1/1990 | Drake et al. |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,912,399 A | 3/1990 | Greub et al. |
| 4,916,002 A | 4/1990 | Carver |
| 4,916,398 A | 4/1990 | Rath |
| 4,918,383 A | 4/1990 | Huff et al. |
| 4,922,128 A | 5/1990 | Dhong et al. |
| 4,922,186 A | 5/1990 | Tsuchiya et al. |
| 4,922,192 A | 5/1990 | Gross et al. |
| 4,929,893 A | 5/1990 | Sato et al. |
| 4,975,638 A | 12/1990 | Evans et al. |
| 4,980,637 A | 12/1990 | Huff et al. |
| 4,983,910 A | 1/1991 | Majidi-Ahy et al. |
| 4,987,100 A | 1/1991 | McBride et al. |
| 4,991,290 A | 2/1991 | MacKay |
| 4,998,062 A | 3/1991 | Ikeda |
| 5,001,423 A | 3/1991 | Abrami et al. |
| 5,003,253 A | 3/1991 | Majidi-Ahy et al. |
| 5,020,219 A | 6/1991 | Leedy |
| 5,021,186 A | 6/1991 | Ota et al. |
| 5,030,907 A | 7/1991 | Yih et al. |
| 5,041,782 A | 8/1991 | Marzan |
| 5,045,781 A | 9/1991 | Gleason et al. |
| 5,059,898 A | 10/1991 | Barsotti et al. |
| 5,061,192 A | 10/1991 | Chapin et al. |

(56) References Cited

U.S. PATENT DOCUMENTS

| | | |
|---|---|---|
| 5,061,823 A | 10/1991 | Carroll |
| 5,066,357 A | 11/1991 | Smyth, Jr. et al. |
| 5,069,628 A | 12/1991 | Crumly |
| 5,082,627 A | 1/1992 | Stanbro |
| 5,084,671 A | 1/1992 | Miyata et al. |
| 5,089,774 A | 2/1992 | Nakano |
| 5,091,692 A | 2/1992 | Ohno et al. |
| 5,091,732 A | 2/1992 | Mileski et al. |
| 5,095,891 A | 3/1992 | Reitter |
| 5,097,101 A | 3/1992 | Trobough |
| 5,097,207 A | 3/1992 | Blanz |
| 5,107,076 A | 4/1992 | Bullock et al. |
| 5,126,286 A | 6/1992 | Chance |
| 5,126,696 A | 6/1992 | Grote et al. |
| 5,133,119 A | 7/1992 | Afshari et al. |
| 5,134,365 A | 7/1992 | Okubo et al. |
| 5,136,237 A | 8/1992 | Smith et al. |
| 5,138,289 A | 8/1992 | McGrath |
| 5,142,224 A | 8/1992 | Smith et al. |
| 5,145,552 A | 9/1992 | Yoshizawa et al. |
| 5,148,103 A | 9/1992 | Pasiecznik, Jr. |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,166,606 A | 11/1992 | Blanz |
| 5,172,049 A | 12/1992 | Kiyokawa et al. |
| 5,172,050 A | 12/1992 | Swapp |
| 5,172,051 A | 12/1992 | Zamborelli |
| 5,177,438 A | 1/1993 | Littlebury et al. |
| 5,180,977 A | 1/1993 | Huff |
| 5,187,443 A | 2/1993 | Bereskin |
| 5,198,752 A | 3/1993 | Miyata et al. |
| 5,198,753 A | 3/1993 | Hamburgen |
| 5,202,558 A | 4/1993 | Barker |
| 5,202,648 A | 4/1993 | McCandless |
| 5,207,585 A | 5/1993 | Byrnes et al. |
| 5,214,243 A | 5/1993 | Johnson |
| 5,214,374 A | 5/1993 | St. Onge |
| 5,225,037 A | 7/1993 | Elder et al. |
| 5,227,730 A | 7/1993 | King et al. |
| 5,232,789 A | 8/1993 | Platz et al. |
| 5,233,197 A | 8/1993 | Bowman et al. |
| 5,233,306 A | 8/1993 | Misra |
| 5,245,292 A | 9/1993 | Milesky et al. |
| 5,266,889 A | 11/1993 | Harwood et al. |
| 5,267,088 A | 11/1993 | Nomura |
| 5,270,664 A | 12/1993 | McMurtry et al. |
| 5,274,336 A | 12/1993 | Crook et al. |
| 5,280,156 A | 1/1994 | Niori et al. |
| 5,293,175 A | 3/1994 | Hemmie et al. |
| 5,298,972 A | 3/1994 | Heffner |
| 5,304,924 A | 4/1994 | Yamano et al. |
| 5,313,157 A | 5/1994 | Pasiecznik, Jr. |
| 5,315,237 A | 5/1994 | Iwakura et al. |
| 5,321,352 A | 6/1994 | Takebuchi |
| 5,321,453 A | 6/1994 | Mori et al. |
| 5,326,412 A | 7/1994 | Schreiber et al. |
| 5,355,079 A | 10/1994 | Evans et al. |
| 5,357,211 A | 10/1994 | Bryson et al. |
| 5,361,049 A | 11/1994 | Rubin et al. |
| 5,363,050 A | 11/1994 | Guo et al. |
| 5,367,165 A | 11/1994 | Toda et al. |
| 5,368,634 A | 11/1994 | Hackett |
| 5,369,368 A | 11/1994 | Kassen et al. |
| 5,371,654 A | 12/1994 | Beaman et al. |
| 5,373,231 A | 12/1994 | Boll et al. |
| 5,374,938 A | 12/1994 | Hatazawa et al. |
| 5,376,790 A | 12/1994 | Linker et al. |
| 5,389,885 A | 2/1995 | Swart |
| 5,395,253 A | 3/1995 | Crumly |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,441,690 A | 8/1995 | Ayala-Esquilin et al. |
| 5,451,722 A | 9/1995 | Gregoire |
| 5,451,884 A | 9/1995 | Sauerland |
| 5,453,404 A | 9/1995 | Leedy |
| 5,457,398 A | 10/1995 | Schwindt et al. |
| 5,467,024 A | 11/1995 | Swapp |
| 5,469,324 A | 11/1995 | Henderson et al. |
| 5,475,316 A | 12/1995 | Hurley et al. |
| 5,476,211 A | 12/1995 | Khandros |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,488,954 A | 2/1996 | Sleva et al. |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,510,792 A | 4/1996 | Ono et al. |
| 5,511,010 A | 4/1996 | Burns |
| 5,512,835 A | 4/1996 | Rivera et al. |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,528,158 A | 6/1996 | Sinsheimer et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,537,372 A | 7/1996 | Albrecht et al. |
| 5,539,323 A | 7/1996 | Davis, Jr. |
| 5,539,676 A | 7/1996 | Yamaguchi |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,578,932 A | 11/1996 | Adamian |
| 5,583,445 A | 12/1996 | Mullen |
| 5,584,120 A | 12/1996 | Roberts |
| 5,584,608 A | 12/1996 | Gillespie |
| 5,589,781 A | 12/1996 | Higgins et al. |
| 5,600,256 A | 2/1997 | Woith et al. |
| 5,601,740 A | 2/1997 | Eldridge et al. |
| 5,610,529 A | 3/1997 | Schwindt |
| 5,611,008 A | 3/1997 | Yap |
| 5,617,035 A | 4/1997 | Swapp |
| 5,623,213 A | 4/1997 | Liu et al. |
| 5,623,214 A | 4/1997 | Pasiecznik, Jr. |
| 5,628,057 A | 5/1997 | Phillips et al. |
| 5,631,571 A | 5/1997 | Spaziani et al. |
| 5,633,780 A | 5/1997 | Cronin |
| 5,634,267 A | 6/1997 | Farnworth et al. |
| 5,635,846 A | 6/1997 | Beaman et al. |
| 5,642,298 A | 6/1997 | Mallory et al. |
| 5,644,248 A | 7/1997 | Fujimoto |
| 5,653,939 A | 8/1997 | Hollis et al. |
| 5,656,942 A | 8/1997 | Watts et al. |
| 5,659,421 A | 8/1997 | Rahmel et al. |
| 5,666,063 A | 9/1997 | Abercrombie et al. |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,685,232 A | 11/1997 | Inoue |
| 5,686,317 A | 11/1997 | Akram et al. |
| 5,688,618 A | 11/1997 | Hulderman et al. |

(56) References Cited

U.S. PATENT DOCUMENTS

| | | |
|---|---|---|
| 5,700,844 A | 12/1997 | Hedrik et al. |
| 5,704,355 A | 1/1998 | Bridges |
| 5,715,819 A | 2/1998 | Svenson et al. |
| 5,720,098 A | 2/1998 | Kister |
| 5,723,347 A | 3/1998 | Hirano et al. |
| 5,726,211 A | 3/1998 | Hedrick et al. |
| 5,731,920 A | 3/1998 | Katsuragawa |
| 5,742,174 A | 4/1998 | Kister et al. |
| 5,744,383 A | 4/1998 | Fritz |
| 5,744,971 A | 4/1998 | Chan et al. |
| 5,748,506 A | 5/1998 | Bockelman |
| 5,751,252 A | 5/1998 | Phillips |
| 5,756,021 A | 5/1998 | Hedrick et al. |
| 5,767,690 A | 6/1998 | Fujimoto |
| 5,772,451 A | 6/1998 | Dozier, II et al. |
| 5,773,780 A | 6/1998 | Eldridge et al. |
| 5,777,485 A | 7/1998 | Tanaka et al. |
| 5,785,538 A | 7/1998 | Beaman et al. |
| 5,792,668 A | 8/1998 | Fuller et al. |
| 5,793,213 A | 8/1998 | Bockelman et al. |
| 5,794,133 A | 8/1998 | Kashima |
| 5,804,607 A | 9/1998 | Hedrick et al. |
| 5,804,982 A | 9/1998 | Lo et al. |
| 5,804,983 A | 9/1998 | Nakajima et al. |
| 5,806,181 A | 9/1998 | Khandros et al. |
| 5,807,107 A | 9/1998 | Bright et al. |
| 5,810,607 A | 9/1998 | Shih et al. |
| 5,810,609 A | 9/1998 | Faraci et al. |
| 5,811,751 A | 9/1998 | Leong et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,824,494 A | 10/1998 | Feldberg |
| 5,829,128 A | 11/1998 | Eldridge et al. |
| 5,829,437 A | 11/1998 | Bridges |
| 5,831,442 A | 11/1998 | Heigl |
| 5,832,601 A | 11/1998 | Eldridge et al. |
| 5,833,601 A | 11/1998 | Swartz et al. |
| 5,838,160 A | 11/1998 | Beaman et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,864,946 A | 2/1999 | Eldridge et al. |
| 5,867,073 A | 2/1999 | Weinreb et al. |
| 5,869,326 A | 2/1999 | Hofmann |
| 5,869,974 A | 2/1999 | Akram et al. |
| 5,874,361 A | 2/1999 | Collins et al. |
| 5,876,082 A | 3/1999 | Kempf et al. |
| 5,878,486 A | 3/1999 | Eldridge et al. |
| 5,883,522 A | 3/1999 | O'Boyle |
| 5,883,523 A | 3/1999 | Ferland et al. |
| 5,884,398 A | 3/1999 | Eldridge et al. |
| 5,888,075 A | 3/1999 | Hasegawa et al. |
| 5,892,539 A | 4/1999 | Colvin |
| 5,896,038 A | 4/1999 | Budnaitis et al. |
| 5,896,326 A | 4/1999 | Akashi |
| 5,900,737 A | 5/1999 | Graham et al. |
| 5,900,738 A | 5/1999 | Khandros et al. |
| 5,903,143 A | 5/1999 | Mochizuki et al. |
| 5,905,421 A | 5/1999 | Oldfield |
| 5,910,727 A | 6/1999 | Fujihara et al. |
| 5,912,046 A | 6/1999 | Eldridge et al. |
| 5,914,613 A | 6/1999 | Gleason et al. |
| 5,914,614 A | 6/1999 | Beaman et al. |
| 5,916,689 A | 6/1999 | Collins et al. |
| 5,917,707 A | 6/1999 | Khandros et al. |
| 5,926,029 A | 7/1999 | Ference et al. |
| 5,926,951 A | 7/1999 | Khandros et al. |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,959,461 A | 9/1999 | Brown et al. |
| 5,963,364 A | 10/1999 | Leong et al. |
| 5,970,429 A | 10/1999 | Martin |
| 5,973,504 A | 10/1999 | Chong |
| 5,981,268 A | 11/1999 | Kovacs et al. |
| 5,982,166 A | 11/1999 | Mautz |
| 5,983,493 A | 11/1999 | Eldridge et al. |
| 5,990,695 A | 11/1999 | Daugherty, Jr. |
| 5,993,611 A | 11/1999 | Moroney, III et al. |
| 5,994,152 A | 11/1999 | Khandros et al. |
| 5,995,914 A | 11/1999 | Cabot |
| 5,996,102 A | 11/1999 | Haulin |
| 5,998,228 A | 12/1999 | Eldridge et al. |
| 5,998,768 A | 12/1999 | Hunter et al. |
| 5,998,864 A | 12/1999 | Khandros et al. |
| 5,999,268 A | 12/1999 | Yonezawa et al. |
| 6,001,760 A | 12/1999 | Katsuda et al. |
| 6,002,426 A | 12/1999 | Back et al. |
| 6,013,586 A | 1/2000 | McGhee et al. |
| 6,019,612 A | 2/2000 | Hasegawa et al. |
| 6,020,745 A | 2/2000 | Taraci |
| 6,023,103 A | 2/2000 | Chang et al. |
| 6,028,435 A | 2/2000 | Nikawa |
| 6,029,344 A | 2/2000 | Khandros et al. |
| 6,031,383 A | 2/2000 | Streib et al. |
| 6,032,356 A | 3/2000 | Eldridge et al. |
| 6,032,714 A | 3/2000 | Fenton |
| 6,033,935 A | 3/2000 | Dozier, II et al. |
| 6,034,533 A | 3/2000 | Tervo et al. |
| 6,037,785 A | 3/2000 | Higgins |
| 6,040,739 A | 3/2000 | Wedeen et al. |
| 6,042,712 A | 3/2000 | Mathieu |
| 6,043,563 A | 3/2000 | Eldridge et al. |
| 6,049,216 A | 4/2000 | Yang et al. |
| 6,049,976 A | 4/2000 | Khandros |
| 6,050,829 A | 4/2000 | Eldridge et al. |
| 6,051,422 A | 4/2000 | Kovacs et al. |
| 6,052,653 A | 4/2000 | Mazur et al. |
| 6,054,651 A | 4/2000 | Fogel et al. |
| 6,054,869 A | 4/2000 | Hutton et al. |
| 6,059,982 A | 5/2000 | Palagonia et al. |
| 6,060,888 A | 5/2000 | Blackham et al. |
| 6,060,892 A | 5/2000 | Yamagata |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,075,376 A | 6/2000 | Schwindt |
| 6,078,183 A | 6/2000 | Cole, Jr. |
| 6,078,500 A | 6/2000 | Beaman et al. |
| 6,090,261 A | 7/2000 | Mathieu |
| 6,091,236 A | 7/2000 | Piety et al. |
| 6,091,255 A | 7/2000 | Godfrey |
| 6,096,567 A | 8/2000 | Kaplan et al. |
| 6,100,815 A | 8/2000 | Pailthorp |
| 6,104,201 A | 8/2000 | Beaman et al. |
| 6,104,206 A | 8/2000 | Verkuil |
| 6,110,823 A | 8/2000 | Eldridge et al. |
| 6,114,864 A | 9/2000 | Soejima et al. |
| 6,114,865 A | 9/2000 | Lagowski et al. |
| 6,118,287 A | 9/2000 | Boll et al. |
| 6,118,894 A | 9/2000 | Schwartz et al. |
| 6,124,725 A | 9/2000 | Sato |
| 6,127,831 A | 10/2000 | Khoury et al. |
| 6,137,302 A | 10/2000 | Schwindt |
| 6,144,212 A | 11/2000 | Mizuta |
| 6,147,502 A | 11/2000 | Fryer et al. |
| 6,147,851 A | 11/2000 | Anderson |
| 6,150,186 A | 11/2000 | Chen et al. |
| 6,160,407 A | 12/2000 | Nikawa |
| 6,160,412 A | 12/2000 | Martel et al. |
| 6,166,333 A | 12/2000 | Crumly et al. |
| 6,166,553 A | 12/2000 | Sinsheimer |
| 6,168,974 B1 | 1/2001 | Chang et al. |
| 6,169,410 B1 | 1/2001 | Grace et al. |

(56) References Cited

U.S. PATENT DOCUMENTS

| | | |
|---|---|---|
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,206,273 B1 | 3/2001 | Beaman et al. |
| 6,208,225 B1 | 3/2001 | Miller |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,250,933 B1 | 6/2001 | Khoury et al. |
| 6,251,595 B1 | 6/2001 | Gordon et al. |
| 6,255,126 B1 | 7/2001 | Mathieu et al. |
| 6,256,882 B1 | 7/2001 | Gleason et al. |
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,387 B1 | 10/2001 | Gleason et al. |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,211 B2 | 6/2002 | Hamel et al. |
| 6,404,213 B2 | 6/2002 | Noda |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,419,500 B1 | 7/2002 | Kister |
| 6,420,722 B2 | 7/2002 | Moore et al. |
| 6,420,887 B1 | 7/2002 | Kister et al. |
| 6,424,164 B1 | 7/2002 | Kister |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge et al. |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,514,783 B1 | 2/2003 | Welstand |
| 6,520,778 B1 | 2/2003 | Eldridge et al. |
| 6,525,552 B2 | 2/2003 | Kister |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,530,148 B1 | 3/2003 | Kister |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,586,956 B2 | 7/2003 | Aldaz et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |

(56) References Cited

U.S. PATENT DOCUMENTS

| | | |
|---|---|---|
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,386 B2 | 3/2004 | Gleason et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller et al. |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,890 B2 | 1/2005 | Tervo et al. |
| 6,839,964 B2 | 1/2005 | Henson |
| 6,845,491 B2 | 1/2005 | Miller et al. |
| 6,856,129 B2 | 2/2005 | Thomas et al. |
| 6,856,150 B2 | 2/2005 | Sporck et al. |
| 6,860,009 B2 | 3/2005 | Gleason et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,917,732 B2 | 7/2005 | Miyata et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijyo et al. |
| 6,927,079 B1 | 8/2005 | Fyfield |
| 6,927,586 B2 | 8/2005 | Thiessen |

(56) References Cited

U.S. PATENT DOCUMENTS

| | | |
|---|---|---|
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,039 B2 | 8/2005 | Barr et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Actmann et al. |
| 6,944,380 B1 | 9/2005 | Hideo et al. |
| 6,946,375 B2 | 9/2005 | Hattori et al. |
| 6,946,859 B2 | 9/2005 | Karavakis et al. |
| 6,946,860 B2 | 9/2005 | Cheng |
| 6,948,391 B2 | 9/2005 | Brassell et al. |
| 6,948,981 B2 | 9/2005 | Pade |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,057,404 B2 | 6/2006 | Gleason et al. |
| 7,088,981 B2 | 8/2006 | Chang |
| 7,096,133 B1 | 8/2006 | Martin et al. |
| 7,148,711 B2 | 12/2006 | Tervo et al. |
| 7,187,188 B2 | 3/2007 | Andrews et al. |
| 7,188,037 B2 | 3/2007 | Hidehira |
| 7,212,088 B1 | 5/2007 | Norregaard et al. |
| 7,266,889 B2 | 9/2007 | Gleason et al. |
| 7,368,927 B2 * | 5/2008 | Smith .................. G01R 1/0735 324/754.07 |
| 7,888,957 B2 | 2/2011 | Smith et al. |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0109514 A1 | 8/2002 | Brandorff et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0057957 A1 | 3/2003 | McQuade et al. |
| 2003/0062915 A1 | 4/2003 | Arnold et al. |
| 2003/0072549 A1 | 4/2003 | Facer et al. |
| 2003/0088180 A1 | 5/2003 | vanVeen et al. |
| 2003/0119057 A1 | 6/2003 | Gascoyne et al. |
| 2003/0128086 A1 | 7/2003 | Martin |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gundersen et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0124861 A1 | 7/2004 | Zaerpoor |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |

(56) References Cited

U.S. PATENT DOCUMENTS

| | | |
|---|---|---|
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0077649 A1 | 4/2006 | Kumagai |
| 2006/0155270 A1 | 7/2006 | Hancock et al. |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| EP | 0230348 | 7/1987 |
| EP | 0259163 | 3/1988 |
| EP | 0304868 | 3/1989 |
| EP | 0945736 | 9/1999 |
| JP | 56-88333 | 7/1981 |
| JP | 57-163035 | 10/1982 |
| JP | 62-11243 | 1/1987 |
| JP | 62-51235 | 3/1987 |
| JP | 62-107937 | 5/1987 |
| JP | 62-239050 | 10/1987 |
| JP | 63-108736 | 5/1988 |
| JP | 63-129640 | 6/1988 |
| JP | 1-165968 | 6/1989 |
| JP | 1-214038 | 8/1989 |
| JP | 1-219575 | 9/1989 |
| JP | 2-22836 | 1/1990 |
| JP | 2129393 | 5/1990 |
| JP | 2-191352 | 7/1990 |
| JP | 3-175367 | 7/1991 |
| JP | 3-196206 | 8/1991 |
| JP | 3-228348 | 10/1991 |
| JP | 4-130639 | 5/1992 |
| JP | 4-159043 | 6/1992 |
| JP | 4165361 | 6/1992 |
| JP | 4-206930 | 7/1992 |
| JP | 4-340248 | 11/1992 |
| JP | 5-82631 | 4/1993 |
| JP | 6-85044 | 3/1994 |
| JP | 6-102313 | 4/1994 |
| JP | 6-132709 | 5/1994 |
| JP | 7-12871 | 1/1995 |
| JP | 8-35987 | 2/1996 |
| JP | 8-261898 | 10/1996 |
| JP | 8-330401 | 12/1996 |
| JP | 11-4001 | 1/1999 |
| JP | 2000-329664 | 11/2000 |
| JP | 2001-124676 | 5/2001 |
| JP | 2002-203879 | 7/2002 |
| SU | 843040 | 6/1981 |
| SU | 1392603 | 4/1988 |
| WO | WO 98/07040 | 2/1998 |
| WO | WO 00/73905 | 12/2000 |
| WO | WO 01/07207 | 2/2001 |
| WO | WO 01/69656 | 9/2001 |

OTHER PUBLICATIONS

English-language abstract of German Patent No. DE 3637549, May 11, 1988.
English-language abstract of German Patent No. DE 19522774, Jan. 2, 1997.
English-language abstract of German Patent No. DE 10000324, Jul. 19, 2001.
English-language abstract of Japanese Patent No. JP 53-037077, Apr. 5, 1978.
English-language abstract of Japanese Patent No. JP 53-052354, May 12, 1978.
English-language abstract of Japanese Patent No. JP 55-115383, Sep. 5, 1980.
English-language abstract of Japanese Patent No. JP 56-007439, Jan. 26, 1981.
English-language abstract of Japanese Patent No. JP 57-075480, May 12, 1982.
English-language abstract of Japanese Patent No. JP 62-098634, May 8, 1987.
English-language abstract of Japanese Patent No. JP 63-143814, Jun. 16, 1988.
English-language abstract of Japanese Patent No. JP 63-318745, Dec. 27, 1988.
English-language abstract of Japanese Patent No. JP 1-296167, Nov. 29, 1989.
English-language abstract of Japanese Patent No. JP 2-124469, May 11, 1990.
English-language abstract of Japanese Patent No. JP 51-57790, Jun. 25, 1993.
English-language abstract of Japanese Patent No. JP 51-66893, Jul. 2, 1993.
English-language abstract of Japanese Patent No. JP 60-71425, Mar. 15, 1994.
English-language abstract of Japanese Patent No. JP 7-005078, Jan. 10, 1995.
English-language abstract of Japanese Patent No. JP 10-116866, May 6, 1998.
English-language abstract of Japanese Patent No. JP 11-023975, Jan. 29, 1999.
English-language abstract of Japanese Patent No. JP 2001-189285, Jul. 10, 2001.
English-language abstract of Japanese Patent No. JP 2001-189378, Jul. 10, 2001.
English-language abstract of Japanese Patent No. JP 2002-243502, Aug. 28, 2002.
English-language abstract of PCT Patent Application Publication No. WO 2004/065944, Aug. 5, 2004.
English-language abstract of PCT Patent Application Publication No. WO 2004/079299, Sep. 16, 2004.
English-language abstract of PCT Patent Application Publication No. WO 2005/062025, Jul. 7, 2005.
Aebersold, Ruedi, et al., "insight review articles, Mass spectrometry-based proteomics," Nature, vol. 422, Mar. 13, 2003, pp. 198-207.
Afsar, Mohammed Nurul, et al., "The Measurement of the Properties of Materials," Proceedings of the IEEE, vol. 74, No. 1, Jan. 1986, pp. 183-199.
Basu, Saswata, et al., "An SOLR Calibration for Accurate Measurement of Orthogonal On-Wafer DUTS," 1997 IEEE MTT-S Digest, pp. 1335-1338.
Boguski, Mark S., et al., "Biomedical informatics for proteomics," insight: review article, Nature, vol. 422, pp. 233-237, Mar. 13, 2003; doi:10.1038/nature01515.
Cascade Microtech, Inc., "Probe Heads, Care and cleaning of coaxial input microwave probes," Microwave Probe Care and Cleaning Instruction Manual, 1990, 28 pages.
Cascade Microtech, Inc., "Information Sheet for Pyramid Probe," 5 pages, 2001.
Fink, Donald G., et al., "Bridge Circuits, Detectors, and Amplifiers, Principles of Bridge Measurements," Electronics Engineers' Handbook, First Edition, McGraw-Hill Book Company, New York, 1975, pp. 17-22-17-27.

(56) References Cited

OTHER PUBLICATIONS

Grober, Robert D., et al., "Optical antenna: Towards a unity efficiency near-field optical probe," Appl. Phys. Lett. 70 (11), Mar. 17, 1997, American Institute of Physics, 1997, pp. 1354-1356.

Hanash, Sam, "insight review articles, Disease proteomics," Nature, vol. 422, Mar. 13, 2003, pp. 226-232.

Hayden, Leonard, "A Multi-Line TRL Calibration," Feb. 2, 1994, 5 pages.

Kim, Yong-Dae, et al., "Fabrication of a Silicon Micro-Probe for Vertical Probe Card Application," Japanese Journal of Applied Physics, vol. 37, pp. 7070-7073, 1998.

Kraszewski, Andrzej W., et al., "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Liang, Qingqing, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Marte, Barbara, Senior Editor, "Nature Insight Proteomics," Nature, vol. 422, Mar. 13, 2003, pp. 191-194.

Martens, J., "Multiport SOLR Calibrations: Performance and an Analysis of Some Standards Dependencies," ARFTG Microwave Measurements Conference, Dec. 4-5, 2003, pp. 205-213.

Phizicky, Eric, et al., "insight: review article, Protein analysis on a proteomic scale," Nature, vol. 422, pp. 208-215, Mar. 13, 2003; doi: 10.1038/nature01512.

Purroy, Francesc, et al., "New Theoretical Analysis of the LRRM Calibration Technique for Vector Network Analyzers," IEEE Transactions on Instrumentation and Measurement, vol. 50, No. 5, Oct. 2001, pp. 1307-1313.

Risacher, Christophe, et al., "Waveguide-to-Microstrip Transition With Integrated Bias-T," IEEE Microwave and Wireless Components Letters, vol. 13, No. 7, Jul. 2003, pp. 262-264.

Sali, Andrej, et al., "insight: review article, From words to literature in structural proteomics," Nature, vol. 422, pp. 216-225, Mar. 13, 2003; doi: 10.1038/nature01513.

Seguinot, Christophe, et al., "Multimode TRL—A New Concept in Microwave Measurements: Theory and Experimental Verification," IEEE Transactions on Microwave Theory and Techniques, vol. 46, No. 5, May 1998, pp. 536-542.

Sharma, Arvind Kumar, "Tunable Waveguide-to-Microstrip Transition for Millimeter-Wave Applications," J-27, RCA Laboratories, David Sarnoff Research Center, Princeton, NJ, 1987 IEEE MTT-S Digest, pp. 353-356.

Sohn, L. L., et al., "Capacitance cytometry: Measuring biological cells one by one," PNAS Sep. 26, 2000, vol. 97, No. 20, pp. 10687-10690, www.pnas.org.

Tyers, Mike, et al., "insight overview, From genomics to proteomics," Nature, vol. 422, Mar. 13, 2003, pp. 193-197.

Venkatesh, M. S., et al., "An overview of dielectric properties measuring techniques," Canadian Biosystems Engineering, vol. 47, 2005, pp. 7.15-7.30.

Xu, Deming, et al., "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

\* cited by examiner

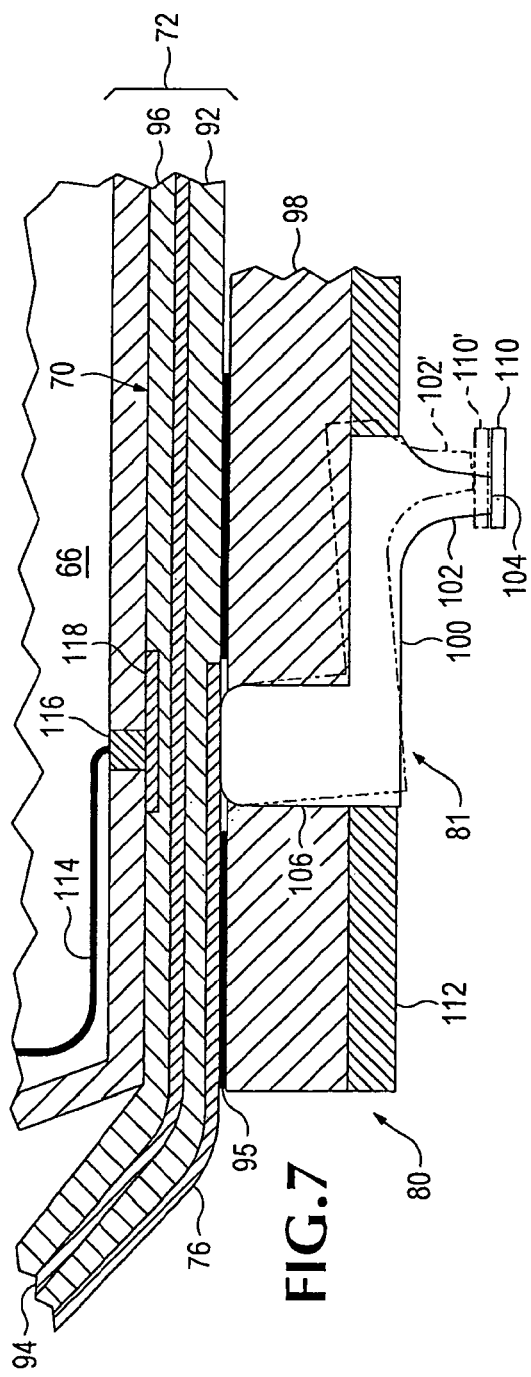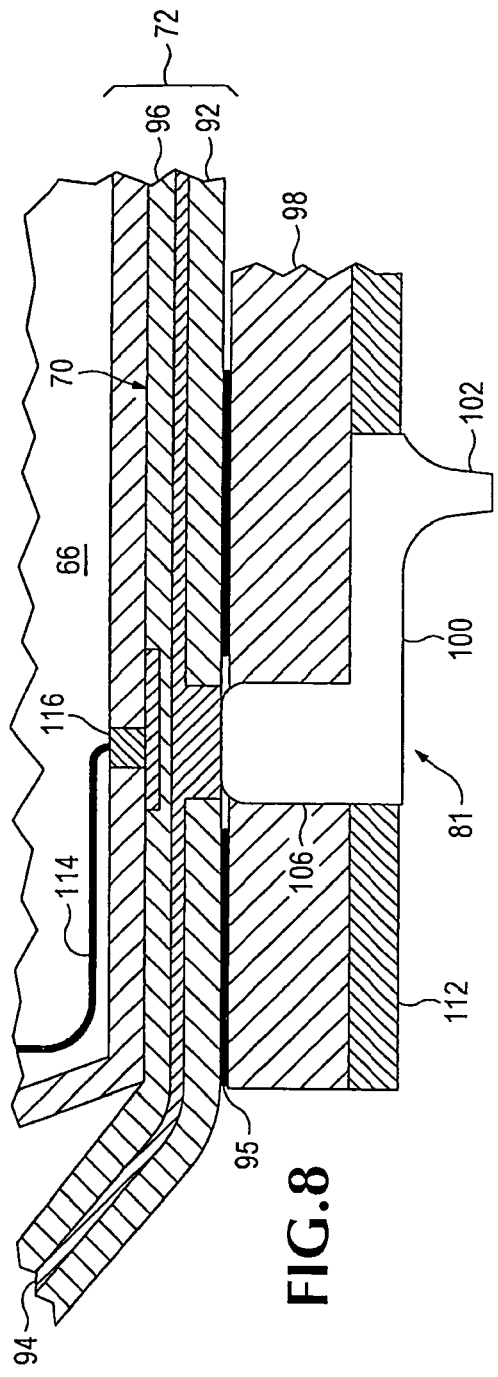

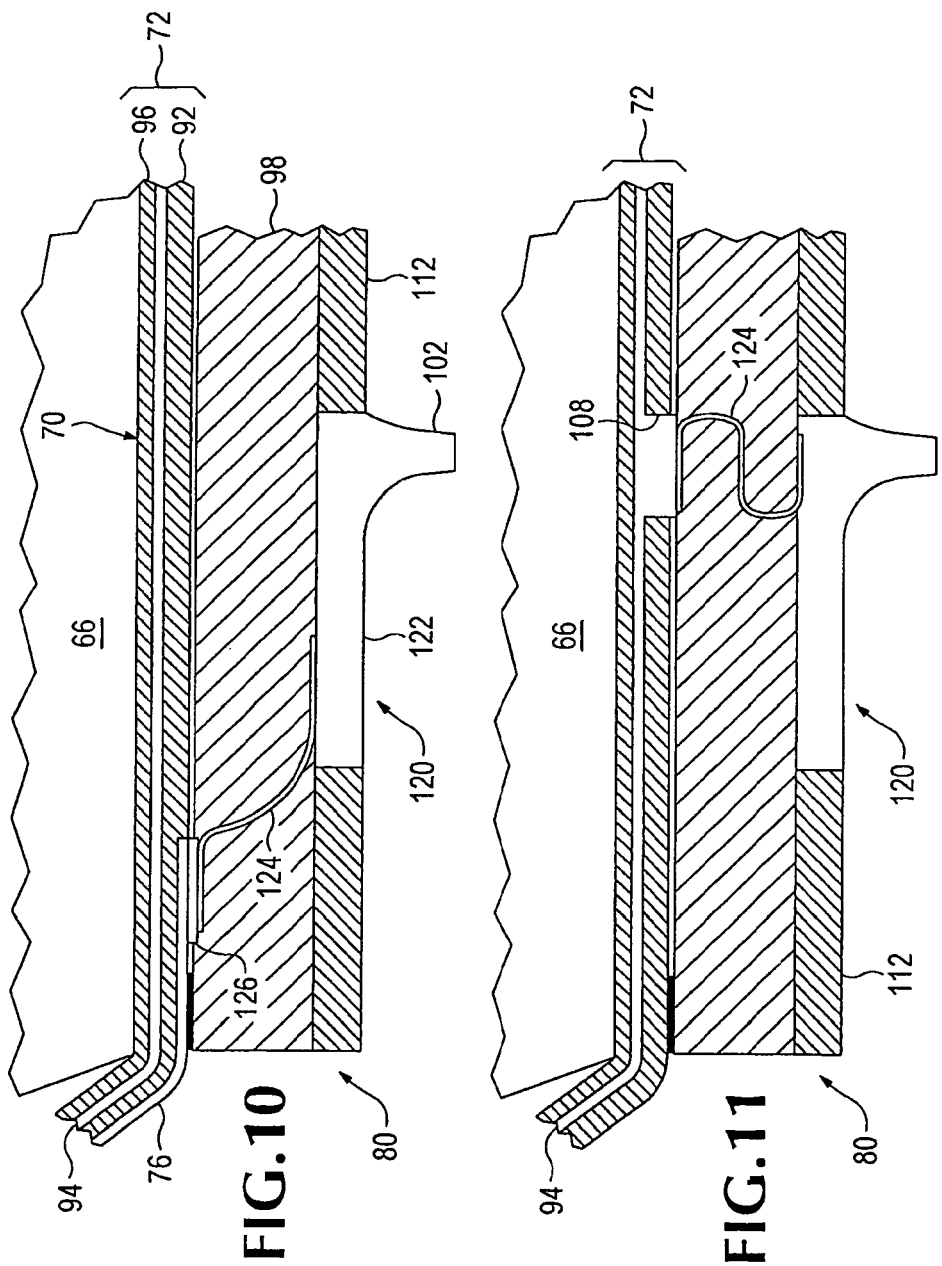

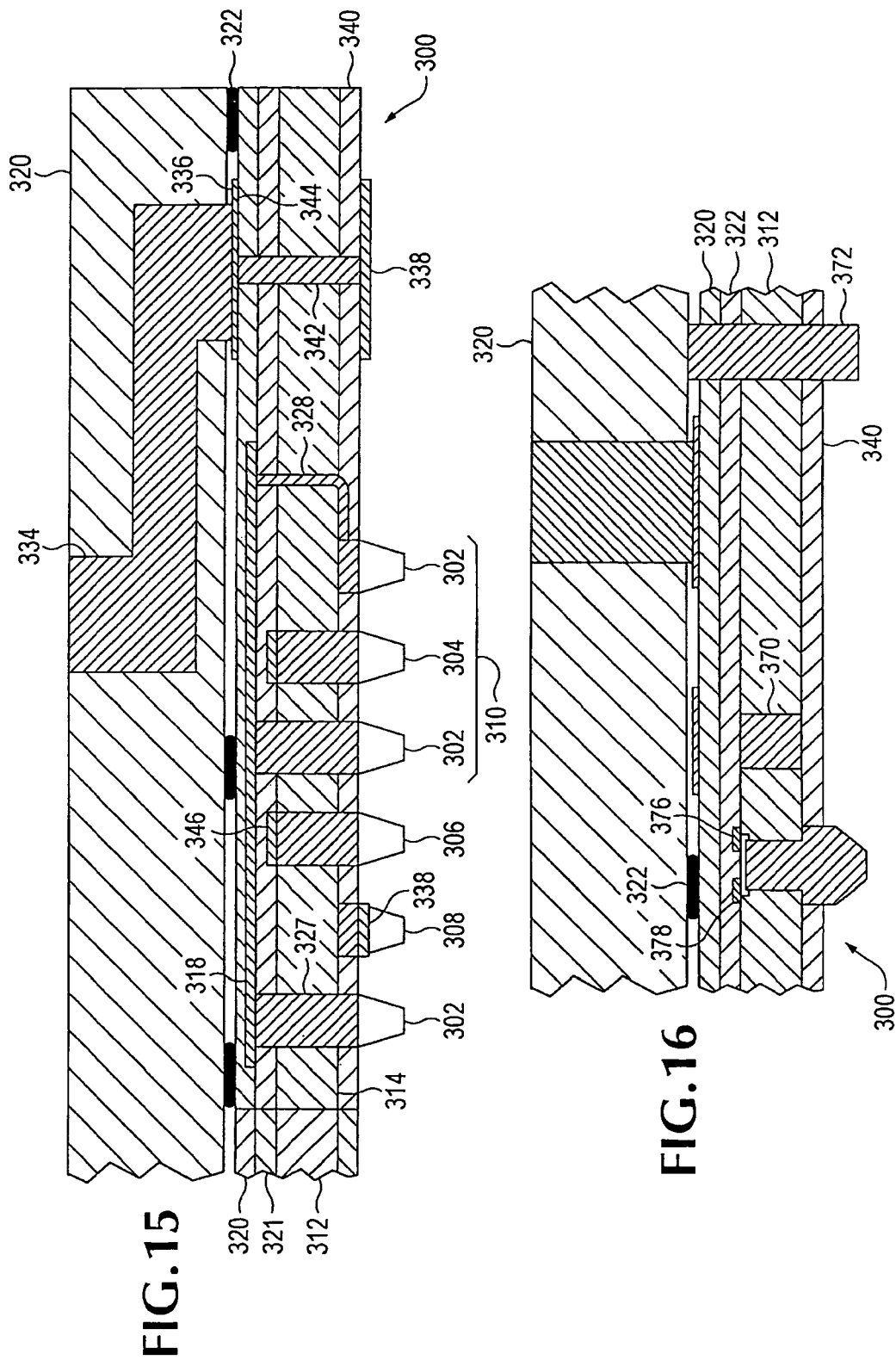

METHOD OF REPLACING AN EXISTING CONTACT OF A WAFER PROBING ASSEMBLY

CROSS-REFERENCE TO RELATED APPLICATIONS

This application is a continuation patent application that claims priority to U.S. Pat. No. 8,410,806, which issued on Apr. 2, 2013, and which claims priority to U.S. Provisional Patent Application Ser. No. 61/199,910, which was filed on Nov. 21, 2008. The entire disclosures of the above-identified patent and patent application are hereby incorporated by reference.

BACKGROUND OF THE INVENTION

The present invention relates to probe assemblies of the type commonly used for testing integrated circuits (ICs) that are fabricated on a wafer or substrate.

The trend in electronic production, particularly in integrated circuit technology, has been toward fabricating larger numbers of discrete circuit elements with higher operating frequencies and smaller geometries on a single substrate or "wafer." After fabrication, the wafer is divided into a number of rectangular-shaped chips or "dies" where each die presents a rectangular or other regular arrangement of metallic bond or contact pads through which connections are made for the inputs and outputs of the electrical circuit on the die. Although each die is eventually packages separately, for efficiency sake, testing of the circuits formed on the wafer is preferably performed while the dies are still joined together on the wafer. One typical procedure is to support the wafer on a flat stage or "chuck" and to move the wafer in X, Y and Z directions relative to the head of a probing assembly so that contacts on the probing assembly move relative to the surface of the wafer for consecutive engagement with the contact pads of one or more of a plurality of dies or test structures on the wafer. Respective signal, power and ground conductors that interconnect the test instrumentation with the contacts on the probing assembly enable each circuit on the wafer to be sequentially connected to the instrumentation and tested.

Gleason et al., U.S. Pat. No. 5,914,613, discloses a membrane probing system for use in a probe station. The membrane probing system comprises a probe head and a membrane probing assembly. The probe head includes an interface board, a multi-layer printed circuit board that facilitates interconnection of the membrane probing assembly and the test instrumentation supplying power and signals to and receiving signals from the electrical circuit being tested, the device-under test (DUT). The power and signals are transmitted over one or more conductors that are conductively interconnected with respective data/signal traces on the interface board. The data/signal traces on the interface board are conductively connected to respective conductive traces on the surface of the membrane assembly. A metallic layer below the surface of the interface board provides a ground plane for the interface board and a ground reference for the power and lower frequency signals.

Typically, higher frequency signals; commonly in the radio or microwave frequency ranges, collectively referred herein to as RF signals; are communicated between the test instrumentation and the membrane probing system with coaxial cable. The coaxial cable is connected to an adapter that is secured to the interface board. A second portion of coaxial cable, conductively interconnected with the first portion in the adapter, is connected to one or more conductive traces on the surface of the interface board. Typically, the end of the second portion of coaxial cable is cut at an angle and the conductors of the cable are connected to respective traces on the interface board to transition the signal path from the coaxial cable to a co-planar waveguide. For example, the center connector of the coaxial cable may soldered to a trace on the interface board while the outer conductor of the cable, connected to a ground potential, is soldered to a pair of traces that are respectively spaced apart to either side of the trace to which the center conductor is connected transitioning the signal path from coaxial cable to a ground-signal-ground (GSG) co-planar waveguide on the interface board. The traces on the interface board are conductively engaged with respective, corresponding traces on the lower surface of the membrane assembly extending the co-planar waveguide to the contacts on the membrane. The impedance of the transition signal path from the coaxial cable to the coplanar waveguide on the membrane is, ideally, optimized, with a typical value of 50 ohms ($\Omega$). However, inconsistencies in connections with the ground plane of the interface board may cause the impedance of a particular signal path to vary from the desired matched impedance producing a reflection of the RF signals that are absorbed by other structures resulting in erratic performance of the probing system.

The membrane of the probing system is supported by a support element that is made of an incompressible material, such as a hard polymer, and detachably affixed to the upper surface of the interface board. The support element includes a forward support or plunger portion that protrudes though a central aperture in the interface board to project below the interface board. The forward support has the shape of a truncated pyramid with a flat forward support surface. The membrane assembly which is also detachably secured to the interface board by the support element includes a center portion that extends over and is separated from the forward support surface of the support element by an intervening elastomeric layer. The flexible membrane assembly comprises one or more plies of insulating sheeting, such as polyimide film. Flexible conductive layers or strips are provided between or on these layers to form power/data/signal traces that interconnect with the traces on the interface board at one end. The second end of the traces on the membrane terminate in conductive connections to respective contacts which are arranged on the lower surface of the portion of the membrane extending over the forward support. The contacts are arranged in a pattern suitable for contacting the bond pads of the DUT when the chuck is moved to bring the contacts of the probe assembly into pressing engagement with the bond pads.

The contacts of the probing system comprise a beam which is affixed to the lower surface of the membrane assembly and which is conductively interconnected with the appropriate trace on the surface of the membrane. A contact bump or tip for engaging a bond pad of the DUT is affixed to one end of the beam. When the contact bump is pressed against the bond pad of the DUT, the membrane assembly is deflected, compressing a portion of the elastomeric layer proximate the end of the beam to which the contact bump is affixed. The compliance of the elastomeric layer enables relative displacement of the respective contact bumps and facilitates simultaneous engagement with a plurality of bond pads that may have respective contact surfaces that lie in different planes. The resilience of the elastomeric layer controls the force exerted by the contacts and returns the contacts to the at-rest position when the probe is withdrawn from pressing engagement with the DUT.

The bond pads on DUTs are subject to the rapid development of a layer of oxidation which can electrically insulate the bond pad from the contact. To improve the conductivity of the bond pad/contact interface, the contacts of membrane probes are commonly pressed into the bond pad with sufficient force to penetrate the oxide layer. While penetration of the oxide layer improves conductivity, excessive force can damage the bond pad. With the membrane probe disclosed by Gleason et al, the force of contact with the bond pad is exerted at one end of the beam and the off-center loading on the beam causes the beam to rotate as the portion elastomeric layer adjacent the deflected end of the beam is compressed. The rotation of the beam causes the surface of the contact bump to translate across the bond pad surface and abrade or scrub the oxide coating on the surface improving conductivity between the bond pad and the contact.

However, the conductors within the membrane assembly and attached to the contacts can be broken by excessive displacement of the contacts or may fail from fatigue due to repeated bending when the contacts are displaced during probing. In addition, bond pad material may build up in the area of the contacts of wafer probing assemblies requiring frequent cleaning and, eventual replacement due to wear. While the membrane assembly is detachable from the interface card for cleaning or replacement, the membrane assembly is complex and fairly expensive to replace.

What is desired, therefore, is a probing apparatus having improved impedance characteristics, longer service life and less expensive contacts that can be quickly replaced.

BRIEF DESCRIPTION OF THE DRAWINGS

FIG. 7 is a sectional view of a membrane and coupon taken along line 7-7 of FIG. 6.

FIG. 8 is a sectional view of a membrane and coupon taken along line 8-8 of FIG. 6.

FIG. 10 is a sectional view of a membrane and coupon illustrating an alternative method of connecting a contact and a membrane supported trace.

FIG. 11 is a sectional view of a membrane and coupon illustrating an alternative method of connecting a contact and a membrane supported trace.

FIG. 15 is a sectional view of the multi-layered tile of FIG. 14 taken along line 15-15.

FIG. 16 is a sectional view of the multi-layered tile of FIG. 14 taken along line 16-16.

DETAILED DESCRIPTION OF PREFERRED EMBODIMENTS

Figure 1:
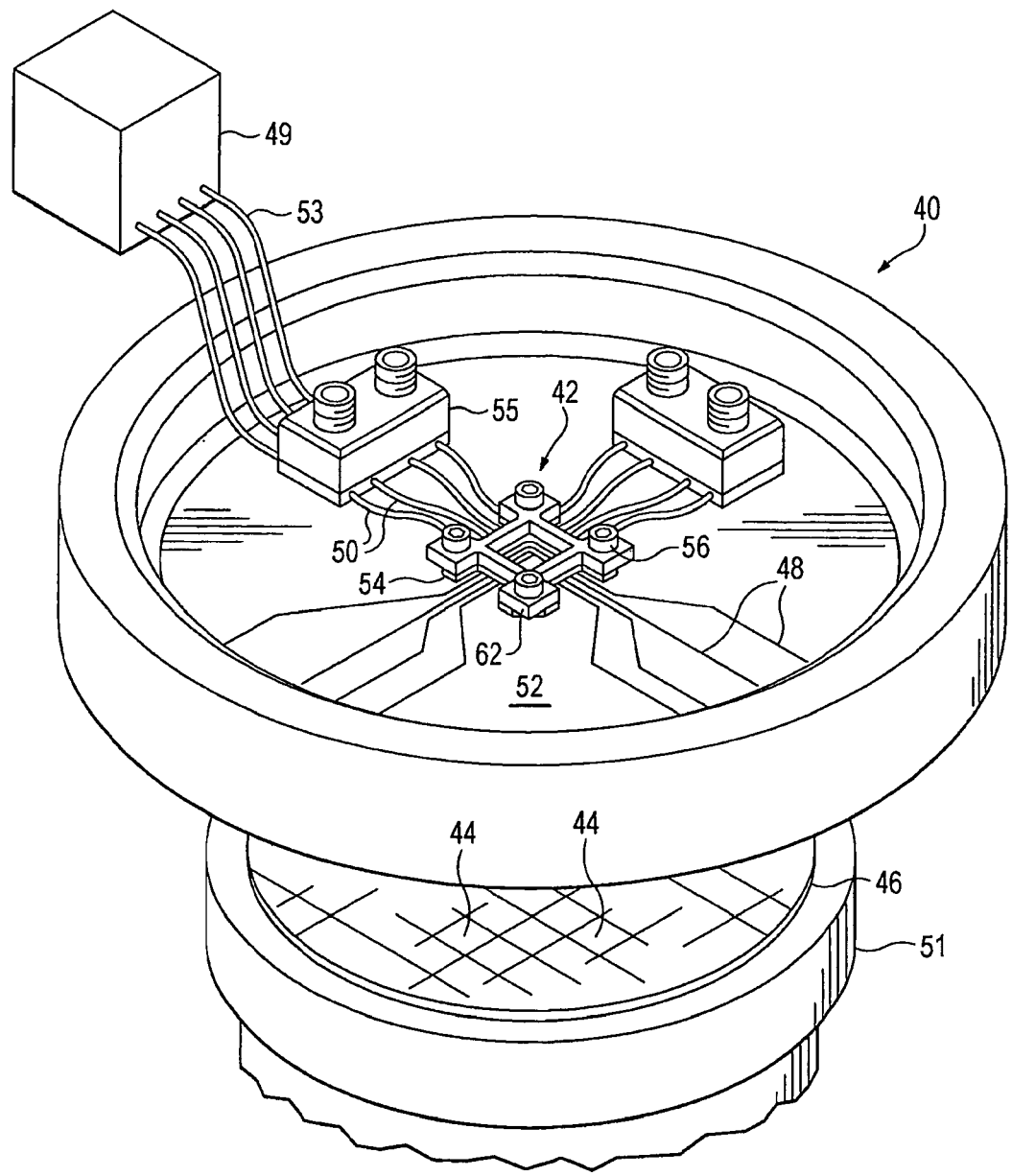
FIG. 1 is a perspective view showing an exemplary membrane probing assembly bolted to a probe head and a wafer supported on a chuck in suitable position for probing by this assembly.
Figure 4:
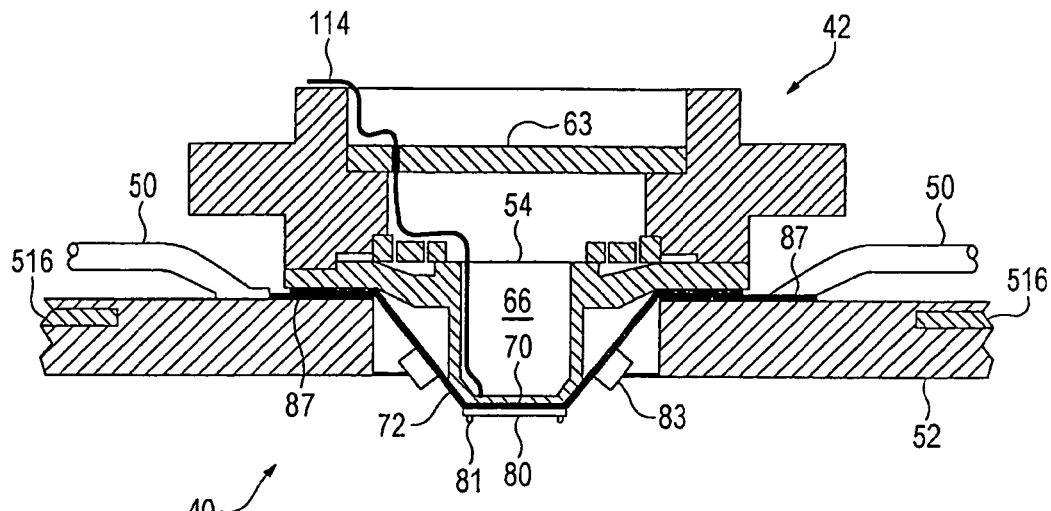
FIG. 4 is a schematic sectional elevation view of an exemplary probing assembly.

Referring in detail to the drawings where similar parts are identified by like reference numerals, and, more particularly to FIGS. 1 and 4, a probe head 40 for mounting a membrane probing assembly 42 is illustrated. In order to measure the electrical performance of the electrical circuit or device-under-test (DUT) of a particular die area 44 included on the silicon wafer 46, input and output ports of the test instrumentation 49 are communicatively connected to contacts 81 included on the lower portion of the membrane probing assembly and the chuck 51 which supports the wafer is moved in mutually perpendicular X, Y, and Z directions in order to bring bond pads of the DUT into pressing engagement with the probe's contacts.

Figure 2:
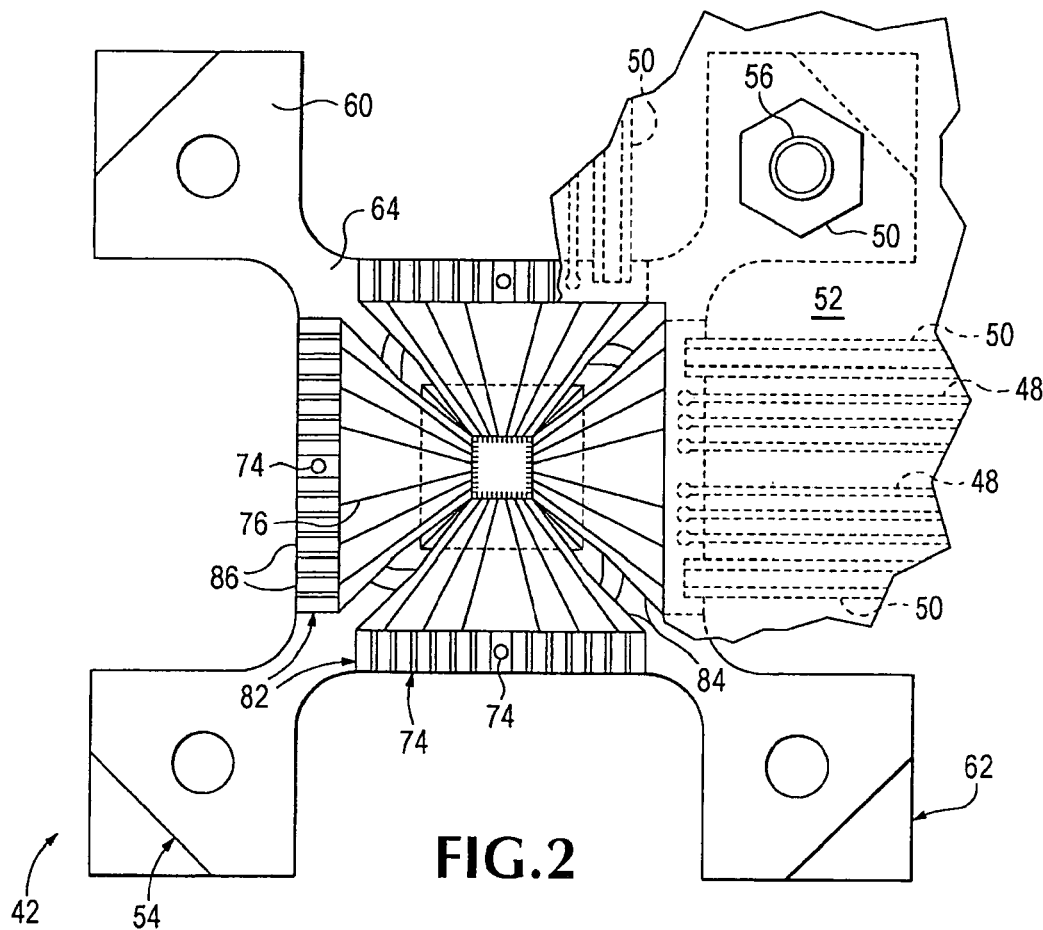
FIG. 2 is a bottom plan view showing various parts of the probing assembly of FIG. 1, including a support element and flexible membrane assembly, and a fragmentary view of a probe card having power, and data/signal lines connected with corresponding lines on the membrane assembly.

The probe head 40 includes an interface board 52 on which traces 48 and shielded transmission lines are arranged for communicating data, signals and power between the test instrumentation and the DUT. Typically, high frequency signals are communicated between the test instrumentation and the probe with co-axial cables 53 which connect the instrumentation to co-axial cable adapters 55 on the interface board. The shielded transmission lines, typically comprising second lengths of co-axial cable 50 connect the adapters to metallic traces 87 on the interface board to transition the communication path from the coaxial cable to a co-planar waveguide. Referring also to FIG. 2, contact portions 86 that terminate conductors on surface of the membrane are arranged to overlap and conductively interconnect with the traces on the interface board extending the co-planar waveguide from the interface board to the lower surface of the membrane assembly in the vicinity of the contacts and, eventually, to appropriate contacts 81 of the probing apparatus.

Figure 3:
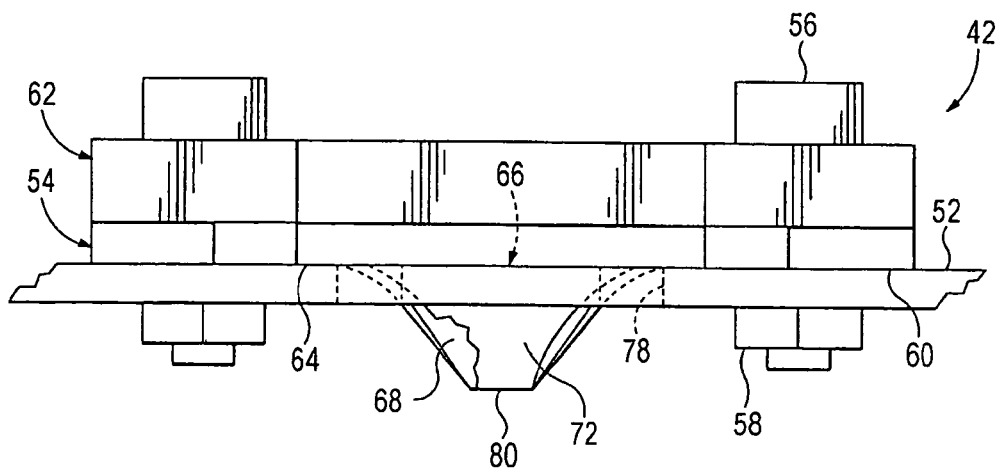
FIG. 3 is a side elevation view of the membrane probing assembly of FIG. 1 where a portion of the membrane assembly has been cut away to expose hidden portions of the support element.

Referring also to FIG. 3, the membrane probing assembly 42 includes a support element 54 formed of incompressible material such as a transparent, hard polymer. This element is detachably connected to the upper side of the interface board by means of four Allen screws 56 and corresponding nuts 58 (each screw passes through a respective attachment arm 60 of the support element, and a separate backing element 62 that evenly distributes the clamping pressure of the screws over the entire back side of the supporting element). This detachable connection enables different membrane assemblies having different arrangements of conductors to be quickly substituted for each other as needed for probing different devices. A transparent window 63 enables an operator of the probing apparatus to view the portion of the wafer in the vicinity of the probe contacts 81.

Figure 5:
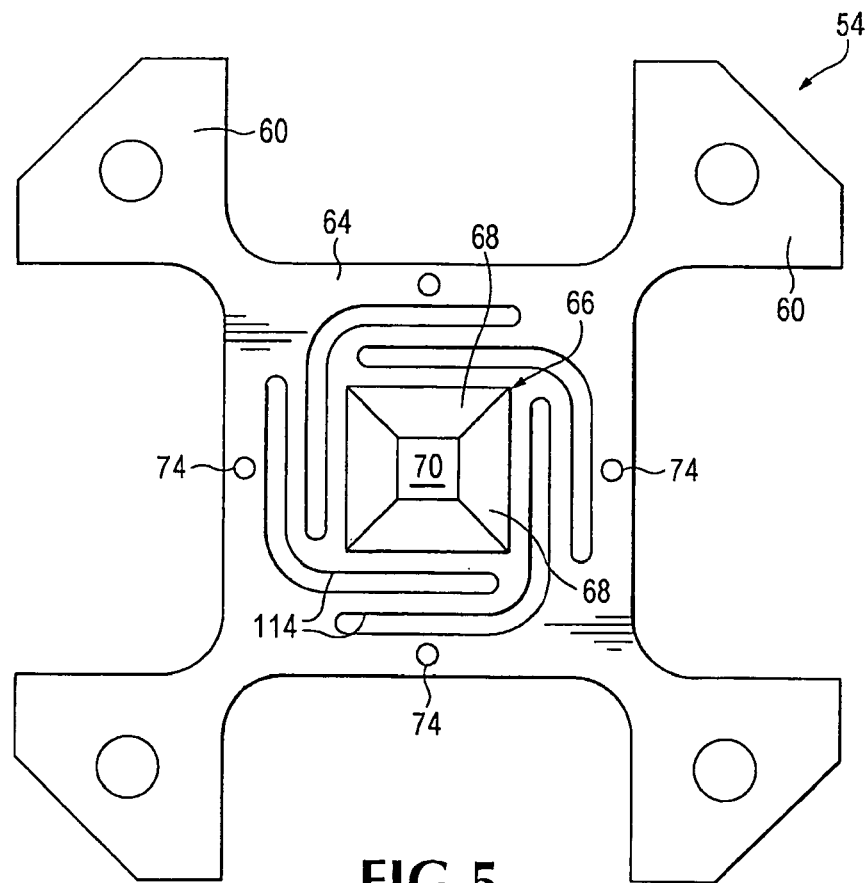
FIG. 5 is a top plan view of an exemplary support element.

Referring to also FIG. 5, the support element 54 includes a rearward base portion 64 to which the attachment arms 60 are integrally joined. Also included on the support element 54 is a forward support or plunger 66 that projects outwardly from the flat base portion. This forward support has angled sides 68 that converge toward a flat support surface 70 so as to give the forward support the shape of a truncated pyramid. Referring also to FIG. 2, a flexible membrane assembly 72 is attached to the support after being aligned by means of alignment pins 74 included on the base portion. This flexible membrane assembly is formed by one or more plies of insulating sheeting such as KAPTON™ polyimide film sold by E. I. Du Pont de Nemours or other polyimide film, and flexible conductive layers or strips are provided on the surfaces of the plies or between the plies to form various conductors connecting the probe's contacts with the traces and shielded transmission lines on the interface board.

When the support element 54 is mounted on the upper side of the interface board 52 as shown in FIG. 3, the forward support 66 protrudes through a central opening 78 in the interface board so as to present the contacts 81 which are arranged on a coupon 80 that is attached to the surface of the membrane assembly 72 in a position suitable for pressing engagement with the pads of the DUT. Referring to FIG. 2, the membrane assembly includes radially extending arm segments 82 that are separated by inwardly curving edges 84 that give the assembly the shape of a formee cross, and these segments extend in an inclined manner along the angled sides 68 thereby clearing any upright components surrounding the pads. A series of contact pads 86 terminate the conductors of the membrane so that when the support element is mounted, these pads electrically engage corresponding termination pads provided on the upper side of the interface board so that the traces 48 and shielded transmission lines 50 on the interface board are conductively connected to the contacts 81 on the coupon 80.

The exemplary membrane probing assembly 42 is capable of probing a dense arrangement of contact pads over a large number of contact cycles in a manner that ensures reliable electrical connection between the contacts and pads during each cycle despite oxide buildup on the pads. This capability is a function of the construction and interconnection of the support element 54, the flexible membrane assembly 72 and the coupon 80. In particular, the membrane probing assembly is so constructed and connected to the support element to enable the contacts to engage a plurality of bond pads on the DUT even if the contact surfaces of the pads are not co-planar. Moreover, the contacts on the membrane assembly preferably wipe or scrub, in a locally controlled manner, laterally across the pads when brought into pressing engagement with the pads. Alternatively, the contacts may be constructed to enable the tips of the contacts to penetrate an oxide coating on the surfaces of the pads with substantially vertical motion. In the event that the contacts require replacement due to, for examples, a built up of pad material, wear, or a change in the arrangement of the pads to be probed, the contacts can be easily replaced by removing and replacing the coupon without the added expense of replacing the membrane assembly.

Referring also to FIGS. 7 and 8, for ease of illustration, an exemplary flexible membrane assembly 72 (indicated by a bracket) comprises one or more traces 76 affixed to an outer surface of a ply 92 comprising a dielectric material which is separated by a backplane conductive layer 94 from a second dielectric ply 96. However, additional dielectric plies and conductive layers can be used in accordance with conventional layering techniques. Preferably, the conductors of the backplane layer and the other traces are fabricated using a photolithographic process to enable precise control of the dimensions of the conductors. The membrane assembly is secured along its edges and extends over the flat support surface 70 of the plunger 66. Typically, the plurality of traces 76 affixed to the outer surface of, the membrane assembly provide communication paths for conducting data/signals and/or power from the conductors at the interface board to the surface of the membrane proximate the forward surface of the plunger. In conjunction with the backplane conductive layer, the conductive traces on the outer surface of the membrane assembly comprise controlled impedance communication structures connecting the interface board to the surface of the membrane in the vicinity of the forward surface of the plunger. The backplane conductive layer 94 may include portions defining one or more apertures which, in turn, define conductive strips of the backplane layer that are located proximate the various traces 76 on the outer surface of the membrane assembly. Filter capacitors 83 may be affixed to the membrane to provide frequency dependent interconnection between the conductive backplane layer and the power and signal conductors.

Figure 6:
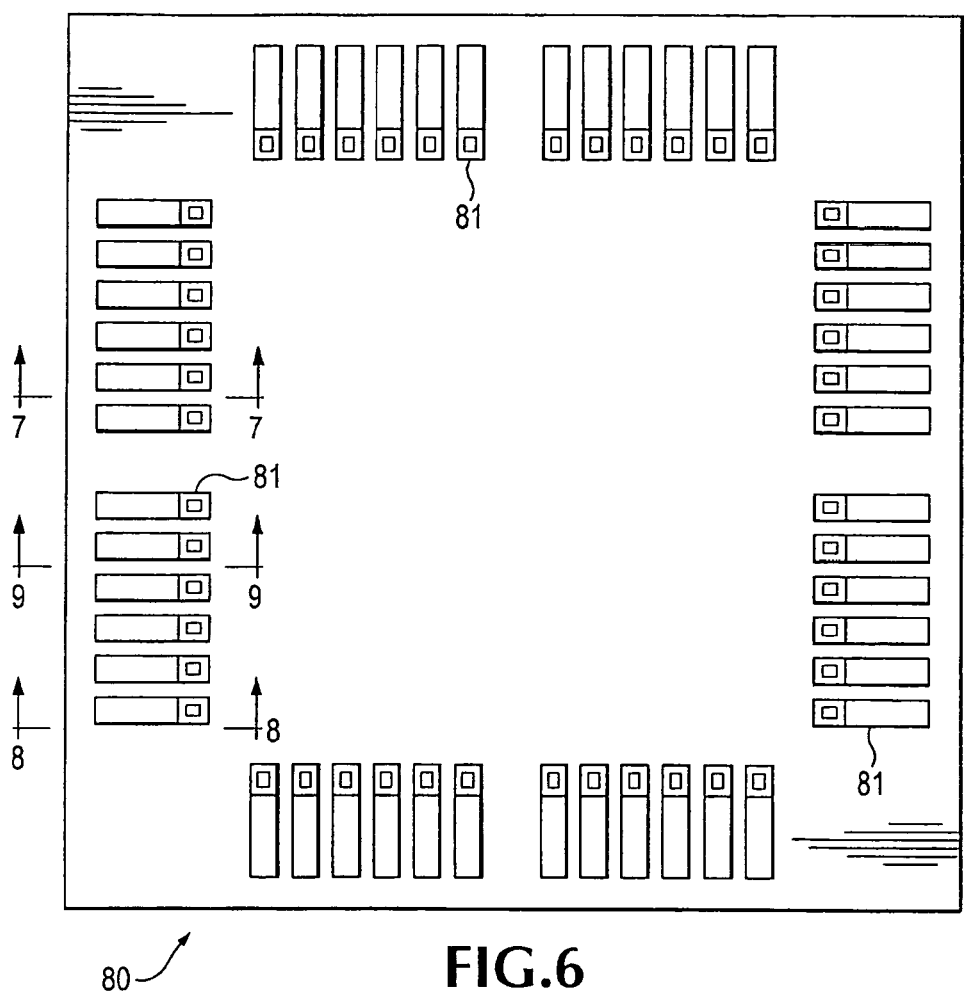
FIG. 6 is a bottom plan view of an exemplary coupon.

FIG. 8 shows an enlarged plan view of the lower surface of an exemplary coupon 80 that is attachable to the lower surface of the membrane 72 in area of the forward support surface 70 of the plunger. Typically, the coupon is attached to the surface of the membrane by an adhesive 95 that enables removal of the coupon by breaking the adhesive bond. The adhesive may be applied proximate the periphery of the coupon, at particular locations on the surface or as layer that substantially covers the surface of the coupon but which is displaced from the points of electrical contact by pressure applied to the lower surface of the coupon. The coupon includes a plurality of contacts 81 which in the illustrated exemplary embodiment are arranged in a square pattern suitable for engaging a square-like arrangement of bond pads. Referring also to FIGS. 7 and 8, which represent sectional views taken along lines 7-7 and 8-8, respectively, in FIG. 6, the coupon comprises an elastomeric layer 98 that is substantially co-extensive with the exposed surface of the portion of the membrane that covers the forward support surface 70 of the plunger. The elastomeric layer can be formed by a silicon rubber compound such as ELMER'S STICK-ALL™ silicon rubber made by the Borden Company or Sylgard 182 silicon rubber from Dow Corning Corporation. Each contact comprises a relatively thick rigid elongate beam 100, preferably 150 to 250 microns long, having an upper surface that is affixed to the elastomeric layer. At one end of the beam a contact tip 102 having the general shape of a truncated pyramid is formed. For wear resistance, the contact tip may include a tip end portion 104 comprising an alloy of rhodium and nickel. Proximate the end of the beam opposite of the contact tip and on the opposite side of the beam, a post portion 106 projects in the direction opposite of the contact tip. The post 106 projects through the elastomeric layer and, preferably, projects proud of the upper surface of the coupon. As illustrated in FIG. 7, the posts of selected contacts are arranged for conductive contact with one of the traces 76 on the outer surface of the membrane. As illustrated in FIG. 8, the posts of other contacts are arranged for conductive contact with contact buttons 108 projecting from the backplane conductive layer 94 through the lower ply 92 of the membrane assembly.

Additional dielectric layers, for example layer 112, may be affixed to the lower surface of the elastic layer.

As indicated in FIG. 7, when an exemplary contact 102 is brought into pressing engagement with a respective bond pad 110, the contact force is exerted upward at the end of the beam to which the contact tip is affixed. However, the opposite end of the beam is constrained by the contact between the post 106 and the trace which is supported by the substantially incompressible membrane. The resulting off-center force on the rigid beam 100 causes the beam to pivot or tilt against the elastic recovery force exerted on the beam by the elastically supported lower surface of elastomeric layer 98. This tilting motion is localized in the sense that the portion of the beam proximate the tip moves a greater distance toward the forward support surface 70 than a rearward portion of the same beam. The effect is such as to cause the tip of the contact to translate across the pad in a lateral scrubbing movement with a solid-line and a dashed-line representing the beginning 102 and ending positions 102', respectively, of the contact tip on the pad 110 which, after displacement relative to the coupon, will be in position 110'. In this fashion, the insulating oxide buildup on the pad is abraded so as to provide reliable probe contact-to-bond pad electrical connections. On the other hand, the movement of the contact does not cause flexing of the trace or other conductor of the membrane which substantially reducing fatigue of the conductors and extending the service life of the membrane.

Figure 9:
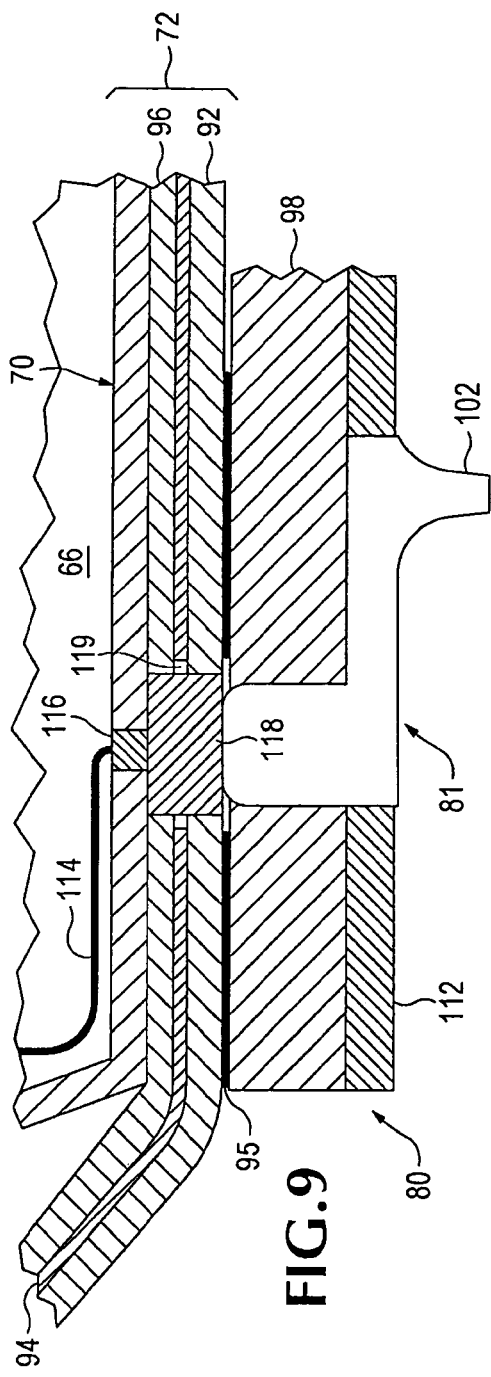
FIG. 9 is a sectional view of a membrane and coupon illustrating connection to a conductor extending through the forward support.

Referring to FIG. 9, the power transmissible on the traces deposited on the plies of the flexible membrane is limited by the cross-section of the traces. As a result, extremely wide traces or large numbers of traces may be required to provide sufficient power to operate the electrical circuits of a DUT or a plurality of DUTs. To increase the power available for testing single or multiple DUTs and reduce the number and size of traces on the membrane, the probing assembly 42 includes a power conductor 114 that is routed through the support 66 to a contact button 116 that extends through the lower wall of the forward support surface 70. The contact button conductively engages a buss 118, which may comprise a grid. On the upper surface of the membrane 72. At selected locations, the buss is extended downward to the lower surface of the membrane through apertures 119 in the other layers of the membrane. Selected contacts 81 include post portions that engage the buss extensions to provide power to the appropriate bond pad(s) of the DUT(s). The buss can have a substantially greater cross-section than the other conductors on the membrane because it is not located in an area of the membrane where flexibility is required.

The resilient elastomeric layer 98 of the coupon, backed by the incompressible support surface 70 and the substantially incompressible membrane 72, exerts a recovery force on each tilting beam contact and thus each contact tip to maintain an adequate level of contact tip-to-bond pad pressure during scrubbing. At the same time, the elastomeric layer accommodates minor height variations between the respective contacts and pads. Thus, when a relatively shorter contact is situated between an immediately adjacent pair of relatively taller contacts and these taller contacts are brought into engagement with their respective pads, deformation of the elastomeric layer enables the shorter contact to be brought into engagement with its pad after only a small amount of further over travel by the longer contact tips. Similarly, the compressibility of the elastomeric layer enables the contact tips to be brought into proper pressing engagement with a plurality of bond pads having surfaces that are not co-planar.

Referring to FIGS. 10 and 11, alternatively, the contacts 120 may comprise an elongate beam portion 122 affixed to the elastically supported lower surface of the elastomer layer 98. The contact tip portion 102 is affixed proximate one end of the beam portion. When the tip is brought into pressing engagement with the bond pad of the DUT, the lower surface of the elastomer layer is displaced proximate the end of the beam to which the tip is affixed, but the elastic force exerted at other end of the beam causes the beam to tilt facilitating the scrubbing action when the tip is pressed toward the bond pad of the DUT. The contact 120 is conductively connected to one of the traces 76 or the backplane layer 94 by a flexible conductive pigtail 124. The conductive pigtail may terminate on the surface of the elastomeric layer at a location suitable for contact with a trace 76 or a contact button 108 or maybe conductively connected with a contact pad 126 suitably located on the surface of the coupon for contact with the appropriate trace or contact button.

Figure 12:
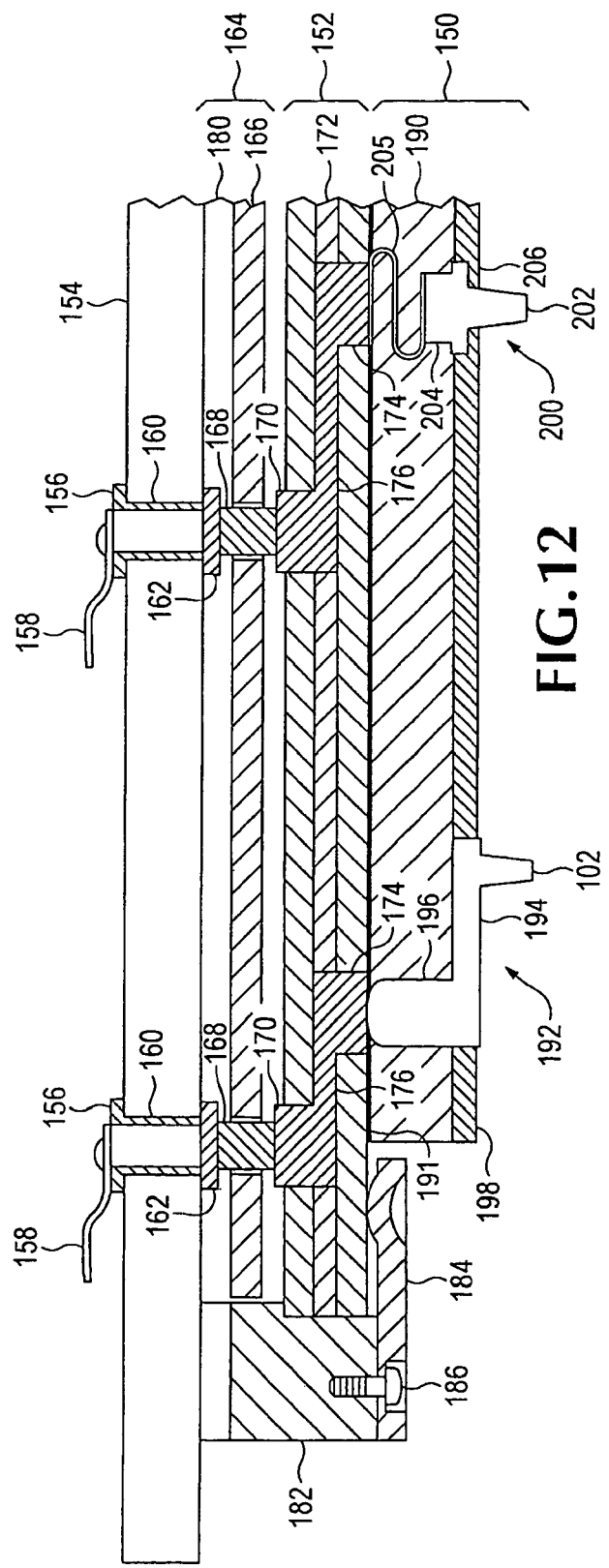
FIG. 12 is a sectional view of a coupon useful with a space transformer of a needle card-type probing apparatus.

FIG. 12 illustrates a coupon 150 (indicated by a bracket) having a plurality of elastomer suspended contacts that is suitable for use with components of a needle card-type probe head enabling the needle card-type probing assembly to be converted to a lower inductance probing assembly with elastically suspended contacts by removing the needle card-type probe head and replacing it with the coupon 150 that interfaces with a space transformer 152 (indicated with a bracket) of the needle card-type probing apparatus. In the schematic cross-sectional view of FIG. 12, the size of certain elements and components are exaggerated, for illustrative clarity. The interface board 154 of the needle card-type probing assembly is generally a conventional circuit board substrate having a plurality of terminals 156 (two of many shown) disposed on a surface thereof. The terminals provide an interface for wires 158 that connect instrumentation (not shown) to the probing assembly. As illustrated, the wires may be connected to terminals on one side of the interface board which are, in turn, connected by conductive vias 160 to terminals 162 or traces on the opposing side of the interface board. Additional components (not shown), such as active and passive electronic components, connectors, and the like, may be mounted on the interface board and connected to additional terminals. The interface board is typically round and commonly has a diameter on the order of 12 inches. The terminals 156, 162 on the interface board are often arranged at a 100 mil pitch or separation distance.

While some probing assemblies do not utilize an interposer, the exemplary probing assembly of FIG. 12 includes an interposer 164 (indicated by a bracket) disposed between the interface board and the space transformer. An interposer comprises interconnected electrical contacts disposed on opposing sides of a substrate so that components on opposing sides of the substrate can be conductively interconnected. An interposer is often used in a probing assembly to facilitate reliable conductive connection between the terminals of an interface board and the terminals of a space transformer. The interposer also aids in accommodating differences in thermal expansion of the interface board and the space transformer. The interposer 164 comprises a substrate 166 and a plurality of fuzz buttons 168 (two are shown) that protrude through holes in the substrate. The fuzz buttons each comprise a fine wire that is compressed into a small cylindrical shape to produce an electrically conductive, elastic wire mass. As a general proposition, the fuzz buttons are arranged at a pitch which matches that of the terminals 162 of the interface board. One end of each of the conductive fuzz buttons is in contact with a terminal on the interface board while the second end of the fuzz button is in contact with a terminal 170 on the space transformer. The elastic fuzz buttons are compressed providing compliance to accommodate variations in the separation distances between of the various terminals of the interface board and the space transformer and exerting pressure on the contacts to promote good conductivity.

The fuzz buttons protruding through the substrate of the interposer 164 contact conductive terminals 170 on one side of the space transformer 152. The space transformer 154 (indicated by a bracket) comprises a suitably circuited substrate 172, such as a multi-layer ceramic substrate having a plurality of terminals (contact areas, pads) 170 (two of many shown) disposed on the surface adjacent to the interposer and a plurality of terminals 174 (contact areas, pads) (two of many shown) disposed on the opposing surface. In the exemplary probing assembly, the contact pads adjacent the interposer are disposed at the pitch of the terminals of the interface board, and the contact pads 174 arranged on the opposing surface of the space transformer are disposed at a finer pitch corresponding to the pitch and arrangement of the needle-type probes included in the needle card with which the space transformer was intended to interface. While the pitch of the terminals of the interface board is commonly approximately 100 mil, the pitch of needle-type probes can be as fine as approximately 125 μm. Conductive traces 176 in the multilayer substrate of the space transformer re-route the electrical connections from the finely pitched pattern required to interface with the probe head to the more coarsely pitched pattern that is obtainable with a printed circuit board, such as the interface board.

The various elements of the probing assembly are stacked and any suitable mechanism for stacking these components and ensuring reliable electrical contacts may be employed. As illustrated, the probing assembly includes a rigid front mounting plate 180 arranged on one side of the interface board. A stand-off 182 with a central aperture to receive the space transformer is attached to the front mounting plate. A mounting ring 184 which is preferably made of a springy material such as phosphor bronze and which may have a pattern of springy tabs extending therefrom, is attachable by screws 186 to the stand-off with the space transformer captured between the mounting ring and the stand-off.

A coupon 150 (indicated by a bracket) comprising an elastomeric layer 190 and a plurality of electrically conductive contacts is affixed to the face of the space transformer, preferably with an adhesive 191. The contacts, for example exemplary contact 192, may comprise, generally, a relatively thick, elongate, rigid beam portion 194 with a post portion 196 proximate one end of the beam and a contact tip 102 projecting in the opposite direction from the opposite side of the beam proximate the second end of the beam. Although other shapes and materials may be utilized, the contact tip preferably has the general shape of a truncated pyramid and the distal end of the contact tip may be coated with a layer of nickel and/or rhodium to provide good electrical conductivity and wear resistant when the contact tip is repeatedly pressed into engagement with the bond pads of DUTs. The post 196 has a rounded end distal of the beam that abuts a terminal 174 of the space transformer 152. The rounded end facilitates movable contact between the post and the terminal when the contact tip is displaced upward by interaction with a bond pad. Additional dielectric layer(s) 198 may be affixed to the lower surface of the elastomeric layer.

The contact 200 exemplifies a second type of contact that may included in the coupon. The contact 200 comprises a contact tip portion 202 which, preferably, has the shape of a truncated pyramid or cone and a body 204 with, preferably, a square or circular cross-section. A shoulder 206 may project from the body adjacent to the bottom surface of the elastomeric layer. The contact is conductively connected to the upper surface of the coupon 150 by a pig-tail 204 that is conductively attached to the body of the contact at one end and has a second end exposed at the upper surface of the coupon. The exposed portion of the pig-tail is arranged to contact a terminal 174 of the space transformer when the coupon is affixed to the surface of the transformer. Alternatively, a conductive connection between the contact and the terminal of the space transformer may incorporate a fuzz button, similar to fuzz button 168, that is embedded in the elastomeric layer with one end exposed at the surface of the coupon and the second end abutting the contact.

For better conductivity between a bond pad and the contact, the tip 202 of the contact 200 is intended to be pushed through the oxide layer that may develop on the surface of a bond pad and the elasticity of the elastomeric layer may be varied to aid penetration of the oxide layer. For example, the body 204 of the contact may be extended so as to directly contact the terminal of the space transformer, eliminating the need for the pigtail and enabling vertical movement of the contact in response to pressure from the pad to be limited to the deflection of the relatively rigid space transformer while the resiliency of the elastomeric layer may enable the contact to tilt if the surface of the pad is not parallel to the end surface of the tip of the contact. On the other hand, the elastomeric layer 190 may comprise a single layer with graduated resiliency or a plurality of sub-layers with differing resiliency to enable controlled vertical movement of the contact in response to the application of force at the tip of the contact. The coupon provides an economical way of converting a needle-type probing apparatus to a probing apparatus with much lower inductance. The relatively long, closely spaced, needle-like probes typically exhibit a single path inductance of 1-2 nano-Henrys (nH) which is sufficient to substantially distort high frequency signals and limit the usefulness of needle-type probes for testing devices with high frequency signals. On the other hand, single path inductance of 0.2 nH has been demonstrated with elastically suspended probes of membrane-type probing apparatuses.

Figure 13:
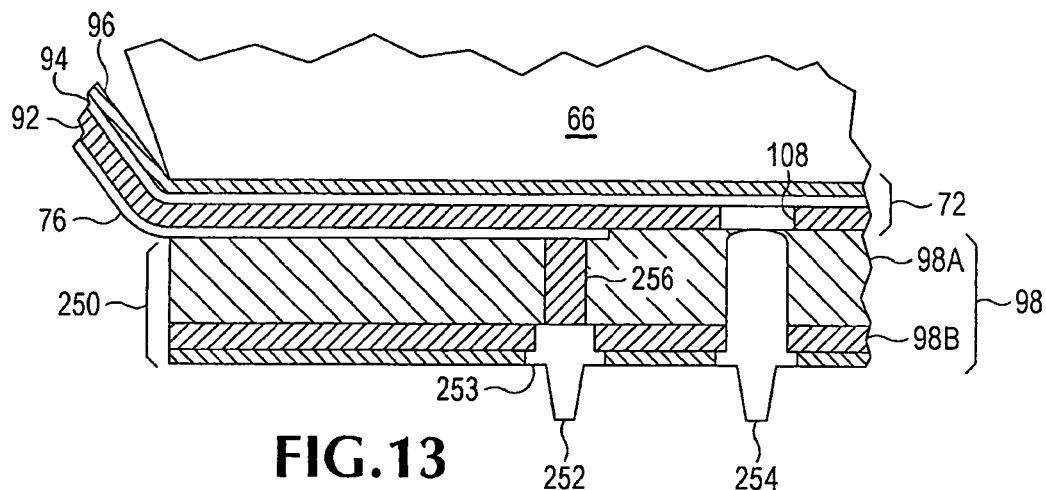
FIG. 13 is a sectional view of additional embodiments of contacts for a coupon useful with a membrane probing device.

Referring to FIG. 13, surface penetrating contacts 252, 254 can also be utilized in a coupon 250 (indicated by a bracket) suitable for use with a membrane probing apparatus. The contact 254 may be rigidly supported by the support 66 and the substantially incompressible membrane assembly 72. As illustrated, the body of the contact is extended through the elastomeric layer 98 so that it abuts the contact button 108 of the backplane layer 94. The abutting end of the contact is rounded enabling tilting of the contact, by compressing the elastomer surrounding the contact's body, to aid in aligning the end of the contact with a non-co-planar pad surface.

On the other hand, the body of the contact 252 terminates in the elastomeric layer and the contact can exhibit elastic behavior as determined by the properties of the elastomer layer. The elastomeric layer 98 may comprise sub-layers 98A and 98B, each having different elastic properties. The elasticity of the contact during vertical displacement may be determined by the properties of the sub-layer 98A which acts on a portion of the surface area of the upper end of the contact and the properties of sub-layer 98B which acts on the upper surface of a contact flange 253. A fuzz button 256 conductively connects the contact 252 with the trace 76.

Figure 14:
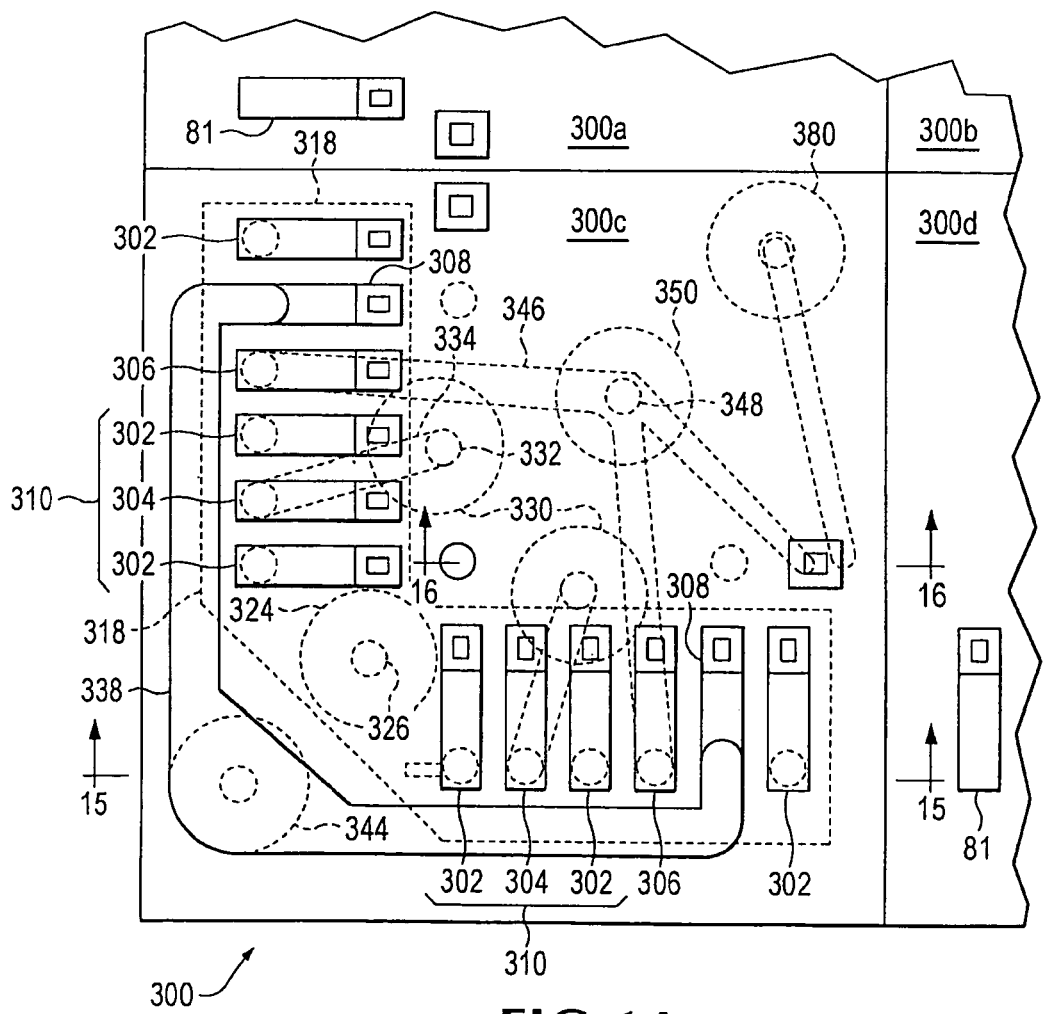
FIG. 14 is a bottom plan view of a multi-layered tile portion of a coupon.

Referring to FIGS. 14 and 15, a coupon 300 for use with a membrane probe or a space transformer may comprise a plurality of coupons or tiles 300a, 300b, 300c, 300d, each independently detachably affixed to a membrane or a space transformer enabling damaged or worn portions of the coupon to be independently replaced or portions of the coupon to include differing arrangements of contacts 81. Flexibility in arranging contacts and conductive connections to membranes and space transformers can be facilitated by layering the conductive and non-conductive elements of the coupon. For example, the tile 300c includes layered circuitry enabling conductive connection of thirteen finely pitched contact tips to a space transformer or membrane having six coarsely pitched contact pads enabling a typically less costly, more coarsely pitched space transformer or membrane to interface with the finely pitched contacts useful for probing small DUTs. The tile includes six grounded contact tips 302 including ground contact tips spaced to each side of a pair of high frequency signal contact tips 304 comprising the terminations of the conductors of a pair of ground-signal-ground (GSG) co-planar waveguides 310 (collectively indicated by a bracket). In addition, the exemplary tile includes a pair of contact tips 308 that are arranged to conduct DC power to a DUT and a pair of contact tips 306 that are arranged to conduct a lower frequency signal to the DUT. The contacts tips of the coupon are affixed to an elastically supported lower surface 314 of an elastomer layer 312. The coupon is affixed the lower surface to a space transformer 320 by adhesive 322.

The ground contact tips 302 are conductively connected to a conductive backplane layer 318 deposited between a pair of dielectric layers 320 and 321. The elastomeric layer is affixed to lower surface of the dielectric layer 321. The backplane layer extends over the area of the coupon that is occupied by the contact tips 302-308. The backplane layer is conductively connected to a suitable conductor in the space transformer by a contact button 324 on the upper surface of the coupon which is connected to the backplane layer by a via 326. The contact button 324 is arranged to engage a corresponding contact button on the lower surface of the space transformer. The contact tips 302 include post portions 327 in contact with backplane or a pigtail 328 that conductively connects the side of the beam portion of the contact tip and the back plane layer.

High frequency signals are transmitted between the test instrument and the DUT through the high frequency contact tips 304. Each of the high frequency contact tips is connected to one of a pair of contact buttons 330 on the upper surface of the coupon by a via 332 and a high frequency signal trace 324 that is deposited between the upper surface of the elastomeric layer 312 and the dielectric layer 321 which separates the high frequency trace from the backplane layer.

The contact tips 308 facilitating the transmission of DC power to the DUT are connected to an appropriate conductor 334 in the space transformer through a contact button 336 on the upper surface of the coupon. A trace 338, including portions that are conductively affixed to the lower surfaces of the beam portions of the power contact tips 308, is affixed to the lower surface of a dielectric layer 340 that is, in turn, affixed to the lower surface of the elastomer layer. A via 342 connects the power trace on the lower surface of the coupon to a contact button 344 on the upper surface of the coupon.

The coupon 300c also enables communication of a lower frequency AC signal to the DUT through contact tips 306 which include posts conductively engaging a lower frequency signal layer 346. The lower frequency signal is conducted from the lower frequency signal layer to the space transformer through a via 348 connecting the lower frequency signal layer with a low frequency signal contact button 350 on the upper surface of the coupon. A multilayered coupon such as the coupon 300 including the tile 300c provides flexibility for connecting an arrangement of finely pitched contact tips with the more coarsely pitched contacts of more moderately priced space transformers.

Referring to FIG. 16, the coupon 300 also includes one or more forming posts 370 that extend from the upper surface of the elastomer layer 312 to the lower surface of the elastomer layer. The forming posts aid in controlling the thickness and in maintaining the planarity of the surfaces of the elastomeric layer during the curing of the elastomer but are not conductively connected to a circuit of the probing apparatus. Posts 372, extending proud of the surfaces of the coupon are not arranged to conduct electricity but may be provided as an aid for the user in gauging the deflection of the elastically suspended contacts. For example, a post 372 having a first end in contact with the space transformer and a second end projecting from the bottom of the coupon a distance slightly less than the height of a contact tip may serve as a contact gage to prevent damage to the coupon from excess deflection of the elastically supported contact tips. Similarly, an elastically supported post 374 that projects below the lower surface of the coupon may be arranged to provide a signal of the limits of contact tip deflection. When the elastically suspended contact tip is pushed upward by engagement with the wafer, the end of the post contacts and conductively connects traces 376, 378 in the coupon to close an electrical circuit and provide a signal at a contact button 380 which may be connected to an indicator circuit.

Figure 17:
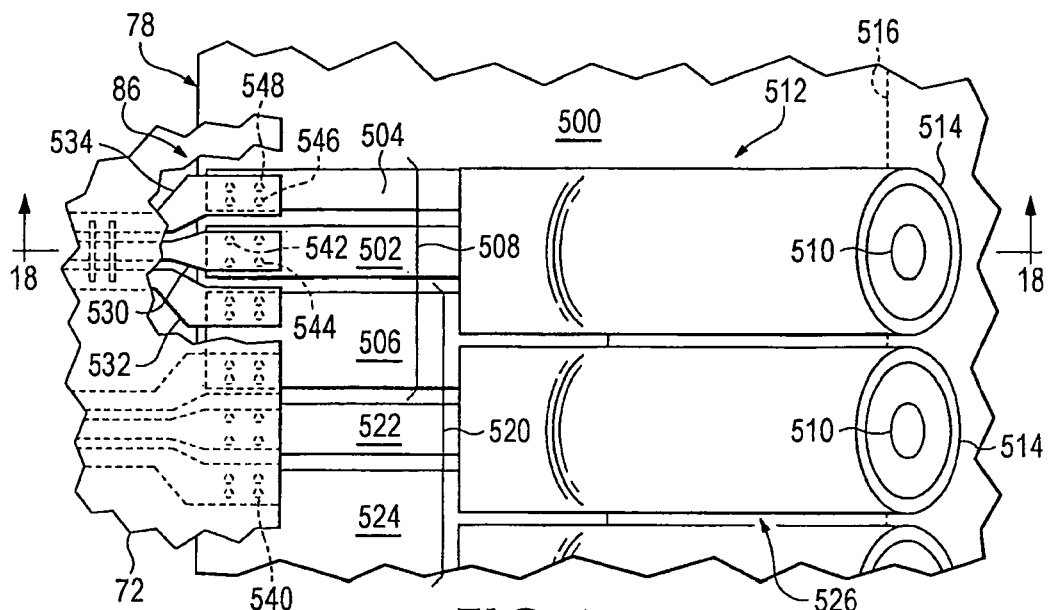
FIG. 17 is a top view of a portion of an exemplary interface board and an impedance optimized co-axial cable to co-planar waveguide interface.

At RF frequencies, signal frequencies in the radio frequency and microwave frequency ranges, it is important to match the impedance, typically 50Ω, of the coaxial cable that typically interconnects the test instrumentation and the probing apparatus with the impedance of the coplanar waveguide that extends from the interface board 52 of the probing apparatus to the lower surface of the membrane in the area of the forward support surface 70. A mismatch of impedance will produce reflections of the signals which can couple to adjacent structures causing frequency dependent inaccuracies in the measurements of the DUT's performance. Referring to FIGS. 4 and 17, to transition the signal path from a coaxial cable 50 to the co-planar waveguide comprising traces on the membrane, the conductors of the coaxial cable are first conductively connected to respective traces 87 on the surface of the interface board which collectively comprise an interface board co-planar waveguide. Typically, the center conductor of the coaxial cable is connected to a center trace and the outer conductor of the cable, which is connected to a ground potential, is connected a pair of side traces, one spaced to either side of the center trace to form a ground-signal-ground (GSG) co-planar waveguide. The traces of the interface board co-planar waveguide terminate proximate the edge of the central opening 78 in the interface board and portions of the conductive traces on the membrane's lower surface are arranged to overlap portions of the surfaces of respective traces of the interface board co-planar waveguide when the membrane is clamped to the interface board. The overlapping surface portions conductively interconnect the traces of interface board waveguide to respective traces of a membrane waveguide extending the signal path to the lower surface of the membrane in the region proximate the forward support surface 70.

Typically, the interface board includes a sub-surface conductive layer that is connected to a ground potential to provide a ground plane for the interface board co-planar waveguide. However, inconsistency in the interconnection of the interface board co-planar waveguide and the ground plane may produce an impedance mismatch as the signal path transitions from coaxial cable to co-planar waveguide. The inventors realized that eliminating the interconnections with the interface board ground plane would eliminate this source of error but would also increase the impedance of the interface board co-planar waveguide to unacceptable levels. The inventors came to the unexpected conclusion that the interface board ground plane could be eliminated by decreasing the gaps between the signal trace and the ground traces of the coplanar waveguide, interconnecting the ground traces of adjacent waveguides and providing a low impedance structure for interconnecting the traces of the membrane and interface board waveguides.

The exemplary interface board 500 includes a plurality of conductive traces deposited on the upper surface. Three traces 502, 504, 506 comprise an interface board co-planar waveguide 508 (indicated by a bracket). The center conductor 510 of a coaxial cable 502 is conductively interconnected with the center trace 502 of the waveguide and the outer conductor 514 of the cable is connected to a first side trace 504 spaced apart from one edge of the center trace and a second side trace 506 spaced apart from the second edge of the center trace. Typically, a signal is communicated between the test instrumentation and the probing apparatus over the center conductor of the coaxial cable and the outer conductor is connected to a ground level electrical potential. The interface board ground plane 516, if any, terminates a substantial distance from the area of the interface board that is overlaid by the traces of the waveguide and is not electrically interconnected with the traces of the waveguide. To reduce the impedance of the "ungrounded" waveguide, the width of the center trace 502 differs from the widths of the side traces and the widths of the respective side traces may also differ from each other. For example, the center trace or signal conductor of an exemplary GSG waveguide having an impedance of 50 Ω is 0.0179 inches wide and is separated from each of the spaced apart side traces of the waveguide by a gap of 0.004 inches. If a side trace, for example the side trace 506 of the exemplary waveguide is adjacent to the center traces of two waveguides, for example center trace 502 and the center trace 522 of a second waveguide 520 (indicated by a bracket), the side trace is shared by the adjacent waveguides 508, 512. The side trace preferably has a width of 0.029 inches and the outer conductors 514 of two adjacent coaxial cables 512, 526 are conductively connected to the trace. If a side trace, for example the side trace 504 of the exemplary interface board co-planar waveguide 508, is adjacent to only one center trace, the side trace has a width of 0.0107 inches.

Figure 19:
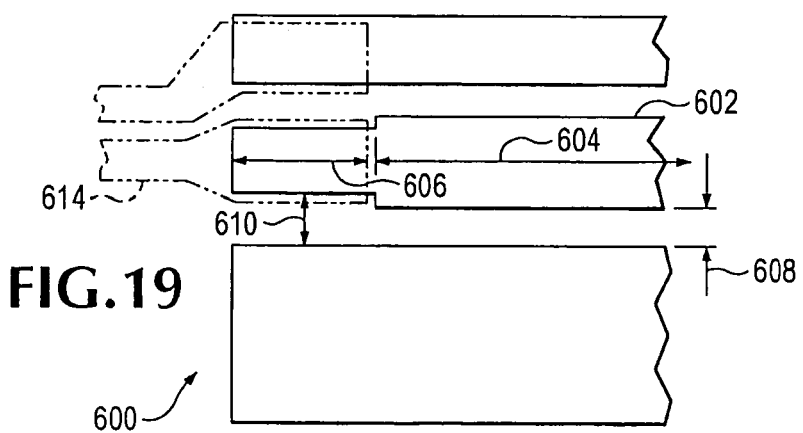
FIG. 19 is a top view of an alternative impedance optimized co-axial cable to co-planar waveguide interface.

Referring to also FIG. 19, while the impedance of a co-planar waveguide is substantially affected by the width of the gap between the traces of the waveguide, to improve the tolerance of the waveguide to misalignment between overlapping portions of the traces of the membrane waveguide and the traces of the interface board waveguide, the width of the center trace of the interface board waveguide may be narrowed for the portion of the length that is overlapped by the membrane trace. For example, the exemplary waveguide 600 includes a central trace 602 comprising a first length portion 604 that is preferably 0.0179 inches wide and a second length portion 606 which is overlapped by the membrane trace 614 and which is preferably 0.0159 inches wide. The gap 608 between the center trace and the side traces for the first length portion is 0.004 inches while the gap 610 for the second length portion is 0.005 inches increasing the tolerance to misalignment between the traces of interface and membrane waveguides. However, the impedance of the exemplary waveguide 600 is substantially the same as the impedance of a waveguide with uniform 0.004 inch gaps between traces.

Figure 18:
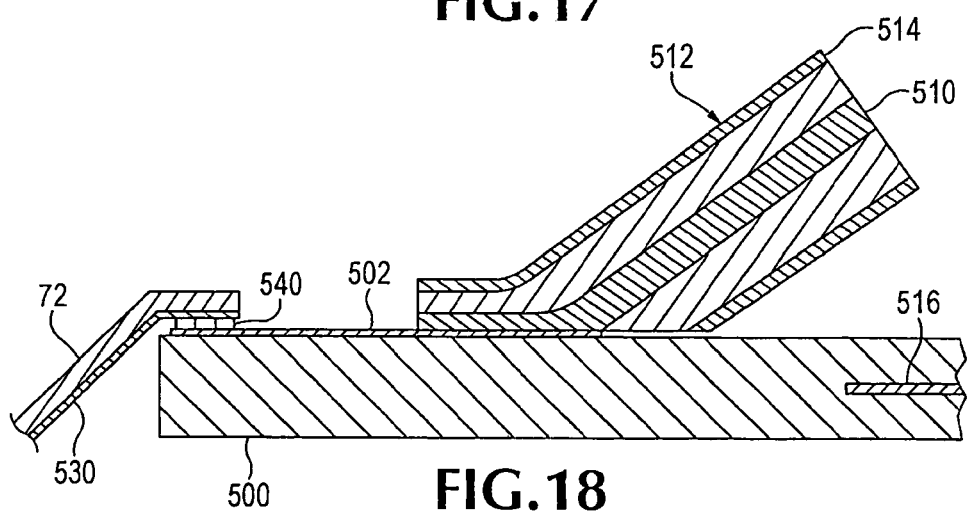
FIG. 18 is a sectional view of the exemplary co-axial cable to co-planar waveguide interface taken along line 18-18 of FIG. 17.

The interconnection of the respective traces of the interface board waveguide and the corresponding traces of the membrane waveguide substantially effects the impedance of the waveguide. The electro-magnetic field is carried in the gap between the traces of a waveguide and the interconnection between the traces can produce a "pinch point" that substantially increases the waveguide's impedance. The inventors concluded that the more closely the geometry of the interconnecting structure resembles the geometry of the waveguide's traces the lower the impedance of the connection. Referring also to FIG. 18, when the membrane probe is assembled, contact portions 86 of the traces on the membrane overlap portions of the surfaces of the traces on the interface board. The inventors concluded that a signal path comprising a plurality of raised pads 540 on one of the overlapping surfaces of a pair of traces would facilitate a low impedance interconnection between the interface board waveguide and the membrane waveguide. The interconnecting structure for the center traces 502 and 530 of the interface board and membrane waveguides, respectively, comprises four pads 540 that project from the surface of one the traces into contact with the surface of the other trace. A pair of the raised pads, indicated generally as 542 and 544, is arranged substantially parallel to each of the edges of the center trace on which the pads are affixed and the pads are located as close to the edge of the trace as tolerance for misalignment of the trace will allow. Preferably, a raised pad is located at each of the corners of a substantially rectangular area on the surface of the trace.

Similarly, a portion of the side trace 534 on the membrane overlaps a portion of the side trace 504 on the surface of the interface board 500 and a portion of the membrane side trace 532 overlaps a portion of the interface board waveguide side trace 506. On the side (ground) traces, the pair 546 of raised pads 540 nearest the center trace 502 are located as close to the inner edge of the trace as is permitted by the tolerance to misalignment and the second pair 548 of raised pads are preferably located nearer the center line of the membrane trace than the second edge of the trace. The electro-magnetic field is carried in the region between the traces of the waveguide and locating the pads of interconnecting structure closer to the region in which the electro-magnetic field is confined reduces the inductance of the connection.

The accuracy of measurements performed with the membrane probing apparatus, particularly at frequencies in the radio and microwave frequency ranges, is improved by optimizing the impedance of the interface between co-axial cables, interconnecting the test instrumentation and the probing apparatus, and the co-planar waveguide that extends the signal path to the contact tips. A longer service life and lower operating cost for a membrane probing apparatus is achievable by including the contact tips on an elastic coupon that is attachable to a membrane that includes a plurality of traces over which signals, data and power can be transmitted. Replacing the probe needles of a needle type probing apparatus with a coupon attachable to a space transformer and including elastically supported contact tips can also improve the performance of a needle-type probing apparatus by substantially lower the inductance of the apparatus.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method of replacing an existing contact of a wafer probing assembly, the method comprising:
    separating an existing coupon from a support surface of the wafer probing assembly, wherein the existing coupon includes an existing elastomeric layer and an existing contact, wherein the support surface is defined by a dielectric support and a support conductor, wherein the existing coupon is detachably affixed to the support surface by an existing adhesive bond, and further wherein the separating includes breaking the existing adhesive bond; and
    detachably affixing a replacement coupon to the support surface of the wafer probing assembly with a replacement adhesive to form a replacement adhesive bond, wherein the replacement coupon includes a replacement elastomeric layer and a replacement contact, and further wherein the detachably affixing further includes establishing electrical communication between the replacement contact and the support conductor.

2. The method of claim 1, wherein the dielectric support and the support conductor form a portion of a flexible membrane assembly, and further wherein the separating includes separating the existing coupon from the flexible membrane assembly.

3. The method of claim 1, wherein the dielectric support and the support conductor form a portion of a space transformer, and further wherein the separating includes separating the existing contact from the space transformer.

4. The method of claim 1, wherein the method includes separating the existing contact from the support surface without separating the dielectric support from the wafer probing assembly.

5. The method of claim 1, wherein the separating and the detachably adhering include re-using the dielectric support.

6. The method of claim 1, wherein, subsequent to the separating and prior to the detachably adhering, the method further includes aligning the replacement coupon with the support surface.

7. The method of claim 6, wherein the aligning includes aligning the replacement contact with the support conductor to permit the electrical communication between the replacement contact and the support conductor subsequent to the detachably affixing.

8. The method of claim 1, wherein the method includes initiating the method responsive to wear of the existing contact.

9. The method of claim 1, wherein the existing contact is configured to engage a first selected location of a first device surface that is defined by a first device, wherein the replacement contact is configured to engage a second selected location of a second device surface that is defined by a second device, wherein the first selected location is different from the second selected location, and further wherein the method includes initiating the method subsequent to probing the first device with the wafer probing assembly and prior to probing the second device with the wafer probing assembly.

10. The method of claim 1, wherein the replacement contact includes a rigid, elongate contact beam, a contact tip, and a post, wherein the contact tip extends from a first end of the contact beam, wherein the post extends from a second end of the contact beam, and further wherein the detachably affixing includes establishing electrical communication between the post and the support conductor.

11. The method of claim 1, wherein the method further includes testing a device with the wafer probing assembly, wherein the testing includes engaging a contact tip of the replacement coupon with a selected location on a device surface that is defined by the device.

12. The method of claim 11, wherein the replacement coupon is a first replacement coupon, wherein, subsequent to the testing, the method further includes repeating the separating to separate the first replacement coupon from the support surface, and further wherein, subsequent to the repeating the separating, the method further includes repeating the detachably affixing to detachably affix a second replacement coupon, which includes a second replacement elastomeric layer and a second replacement contact, to the support surface.

* * * * *